(12) United States Patent
Baek

(10) Patent No.: US 12,507,417 B2
(45) Date of Patent: Dec. 23, 2025

(54) INTEGRATED CIRCUIT DEVICE AND ELECTRONIC SYSTEM INCLUDING THE SAME

(71) Applicant: SAMSUNG ELECTRONICS CO., LTD., Suwon-si (KR)

(72) Inventor: Seokcheon Baek, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 386 days.

(21) Appl. No.: 18/337,180

(22) Filed: Jun. 19, 2023

(65) Prior Publication Data
US 2023/0422527 A1    Dec. 28, 2023

(30) Foreign Application Priority Data

Jun. 22, 2022  (KR) .......................... 10-2022-0076379

(51) Int. Cl.
*H10B 43/50* (2023.01)
*H01L 23/00* (2006.01)
(Continued)

(52) U.S. Cl.
CPC ............ *H10B 43/50* (2023.02); *H01L 24/08* (2013.01); *H01L 24/80* (2013.01); *H01L 25/0657* (2013.01); *H01L 25/18* (2013.01); *H01L 25/50* (2013.01); *H10B 41/27* (2023.02); *H10B 41/30* (2023.02); *H10B 41/35* (2023.02); *H10B 41/40* (2023.02); *H10B 41/41* (2023.02); *H10B 43/20* (2023.02); *H10B 43/27* (2023.02); *H10B 43/35* (2023.02); *H10B 43/40* (2023.02); *H10B 80/00* (2023.02); *H01L 2224/08145* (2013.01); *H01L 2224/80895* (2013.01);
(Continued)

(58) Field of Classification Search
None
See application file for complete search history.

(56) References Cited

U.S. PATENT DOCUMENTS

| | | | |
|---|---|---|---|
| 10,748,923 | B2 | 8/2020 | Son et al. |
| 11,088,166 | B2 | 8/2021 | Oh et al. |

(Continued)

FOREIGN PATENT DOCUMENTS

| | | |
|---|---|---|
| CN | ON 107887395 | 12/2018 |
| CN | 112610062 | 3/2021 |
| CN | 112786607 | 5/2021 |

*Primary Examiner* — Feifei Yeung Lopez
(74) *Attorney, Agent, or Firm* — Morgan, Lewis & Bockius LLP

(57) ABSTRACT

An integrated circuit device includes a first structure and a second structure stacked on the first structure. The first structure includes a first substrate, a peripheral circuit, and a first bonding pad. The second structure includes a second substrate that includes a first side and a second side, a plurality of gate electrodes disposed on the first side of the second substrate, a first cell contact plug that penetrates a first conductive pad of a first gate electrode, is electrically connected to the first gate electrode, penetrates second gate electrodes disposed above the first gate electrode, and is electrically insulated from the second gate electrodes, a first node separation structure that penetrates the second substrate and surrounds an upper part of the first cell contact plug positioned in the second substrate, and a second bonding pad bonded to the first bonding pad.

20 Claims, 20 Drawing Sheets

(51) Int. Cl.
*H01L 25/00* (2006.01)
*H01L 25/065* (2023.01)
*H01L 25/18* (2023.01)
*H10B 41/27* (2023.01)
*H10B 41/30* (2023.01)
*H10B 41/35* (2023.01)
*H10B 41/40* (2023.01)
*H10B 41/41* (2023.01)
*H10B 43/20* (2023.01)
*H10B 43/27* (2023.01)
*H10B 43/35* (2023.01)
*H10B 43/40* (2023.01)
*H10B 80/00* (2023.01)

(52) U.S. Cl.
CPC ............... *H01L 2224/80896* (2013.01); *H01L 2924/1431* (2013.01); *H01L 2924/14511* (2013.01)

(56) References Cited

U.S. PATENT DOCUMENTS

| | | |
|---|---|---|
| 2021/0217760 A1* | 7/2021 | Yang ...................... H10B 43/27 |
| 2021/0287986 A1 | 9/2021 | Gwon et al. |
| 2021/0320122 A1 | 10/2021 | Zhang et al. |
| 2021/0320123 A1* | 10/2021 | Lee ........................ H10B 43/40 |
| 2021/0384218 A1 | 12/2021 | Baek |

* cited by examiner

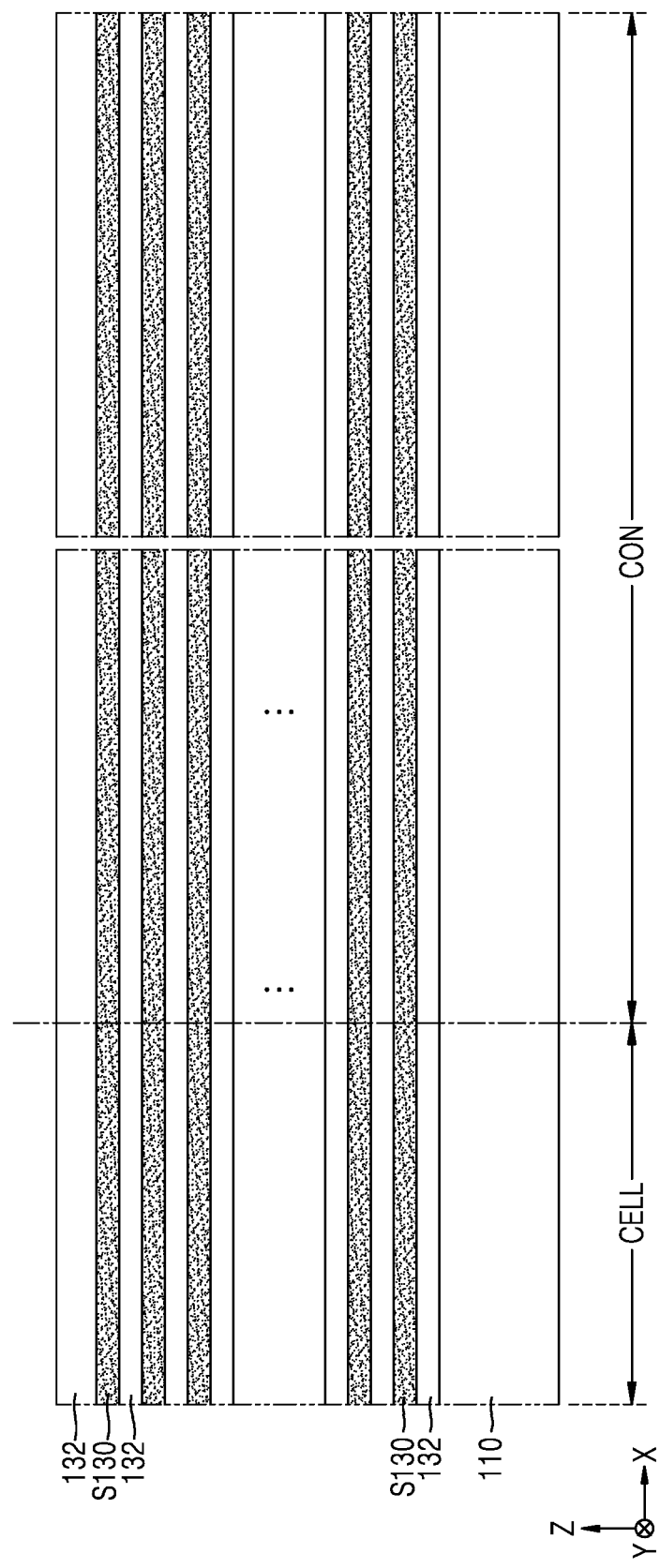

INTEGRATED CIRCUIT DEVICE AND ELECTRONIC SYSTEM INCLUDING THE SAME

CROSS-REFERENCE TO RELATED APPLICATION

This application claims priority under 35 U.S.C. § 119 from Korean Patent Application No. 10-2022-0076379, filed on Jun. 22, 2022 in the Korean Intellectual Property Office, the contents of which are herein incorporated by reference in their entirety.

TECHNICAL FIELD

Embodiments of the inventive concept are directed to an integrated circuit device and an electronic system that includes the integrated circuit device, and more particularly, to an integrated circuit device that includes a nonvolatile vertical memory device and an electronic system that includes the integrated circuit device.

Discussion of the Related Art

Recently, the degree of integration of a memory device has become an important factor determining the economic feasibility of a product. Because the integration degree of a two-dimensional (2D) memory device is mainly determined by an area occupied by a unit memory cell, the integration degree is affected by a fine pattern forming technology. However, because expensive equipment is required to form a fine pattern and the area of a chip die is limited, the integration degree of a 2D memory device is increasing, but is still limited. Accordingly, a vertical memory device that has a three-dimensional (3D) structure is an alternative.

SUMMARY

Embodiments of the inventive concept provide an integrated circuit device that has increased integration and economic feasibility and an electronic system that includes the integrated circuit device, by using a bonding structure of a vertical memory device, to minimize a process margin by changing a position of a landing pad that contacts cell contact plugs that pass through a plurality of gate electrodes and extend in a vertical direction.

According to an embodiment of the inventive concept, there is provided an integrated circuit device that includes a first structure and a second structure stacked on the first structure. The first structure includes a first substrate, a peripheral circuit disposed on the first substrate, a first insulating layer that covers the first substrate and the peripheral circuit, and a first bonding pad disposed on the first insulating layer and is electrically connected to the peripheral circuit. The second structure includes a second substrate that includes a first side that faces the first substrate and a second side opposite to the first side, a plurality of gate electrodes disposed on the first side of the second substrate and that are spaced apart from each other in a vertical direction and stacked in a stair shape, a first cell contact plug that penetrates through a first conductive pad of a first gate electrode of the plurality of gate electrodes, is electrically connected to the first gate electrode, penetrates through second gate electrodes of the plurality of gate electrodes that are disposed above the first gate electrode, and is electrically insulated from the second gate electrodes, a first node separation structure that penetrates through the second substrate and surrounds an upper part of the first cell contact plug positioned in the second substrate, and a second bonding pad electrically connected to a lower part of the first cell contact plug and bonded to the first bonding pad.

According to another embodiment of the inventive concept, there is provided an integrated circuit device that includes a first structure that includes a first substrate, a peripheral circuit disposed on the first substrate, a first insulating layer that covers the first substrate and the peripheral circuit, and a plurality of first bonding pads disposed on the first insulating layer and electrically connected to the peripheral circuit, and a second structure that includes a second substrate that includes first and second sides opposite to each other, a cell region on the first side and a connection region adjacent to the cell region, a gate stack disposed on the first side of the second substrate and that includes a plurality of gate electrodes and a plurality of insulating layers that extend in a horizontal direction and that are alternately stacked in a vertical direction, and that has a stair structure in the connection region, a channel structure and a common source line contact disposed in the cell region and that extend through the gate stack in the vertical direction, a plurality of cell contact plugs disposed in the connection region and that contact and are electrically connected to a conductive pad of a corresponding gate electrode of the plurality of gate electrodes, and that penetrates through the connection region, a plurality of node separation structures that surround upper parts of the plurality of cell contact plugs in the second substrate and insulate the plurality of cell contact plugs from the second substrate, a contact structure disposed on the second side of the second substrate and that includes a first vertical contact that contacts an upper part of the common source line contact and a second vertical contact that contacts the second side of the second substrate, and a plurality of second bonding pads electrically connected to lower parts of the plurality of cell contact plugs and electrically connected to the plurality of first bonding pads. The first structure and the second structure are bonded to each other.

According to another embodiment of the inventive concept, there is provided an electronic system that includes a main substrate, an integrated circuit device disposed on the main substrate, and a controller disposed on the main substrate and that is electrically connected to the integrated circuit device. The integrated circuit device includes a first structure and a second structure stacked on the first structure. The first structure includes a first substrate, a peripheral circuit disposed on the first substrate, a first insulating layer that covers the first substrate and the peripheral circuit, and a first bonding pad disposed on the first insulating layer and electrically connected to the peripheral circuit. The second structure includes a second substrate that includes a first side that faces the first substrate and a second side opposite to the first side, a plurality of gate electrodes disposed on the first side of the second substrate and that are spaced apart from each other in a vertical direction and stacked in a stair shape, a first cell contact plug that penetrates through a first conductive pad of a first gate electrode of the plurality of gate electrodes, is electrically connected to the first gate electrode, penetrates through second gate electrodes of the plurality of gate electrodes that are disposed above the first gate electrode, and is electrically insulated from the second gate electrodes, a first node separation structure that penetrates through the second substrate and surrounds an upper part of the first cell contact plug positioned in the second substrate, and a second bonding pad electrically connected to a lower part of the first cell contact plug and bonded to the first bonding pad.

BRIEF DESCRIPTION OF THE DRAWINGS

FIGS. 9A to 9I are cross-sectional views that sequentially illustrate a method of manufacturing an integrated circuit device, according to an embodiment.

DETAILED DESCRIPTION

Hereinafter, embodiments of the inventive concept will be described in detail with reference to the accompanying drawings.

Figure 1:
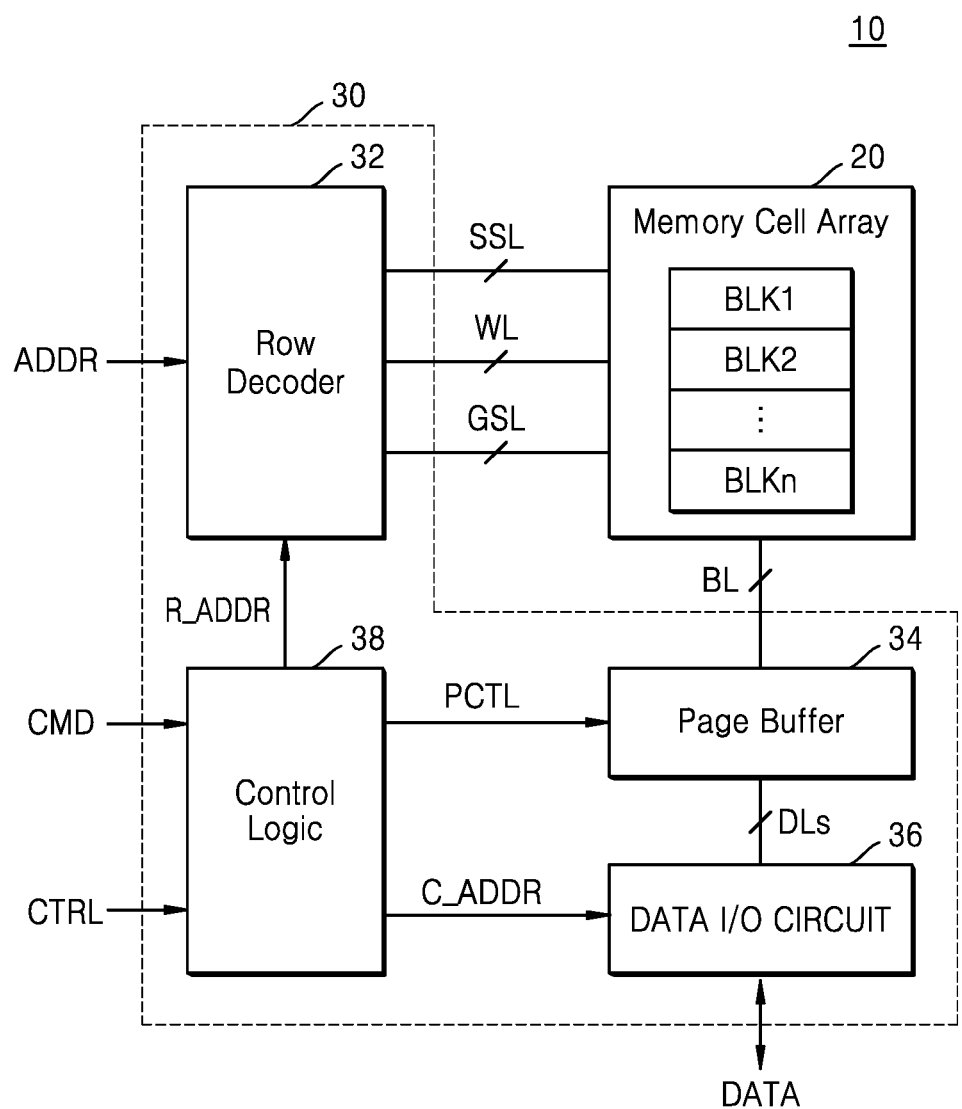
FIG. 1 is a block diagram of an integrated circuit device according to an embodiment.

FIG. 1 is a block diagram of an integrated circuit device according to an embodiment.

Referring to FIG. 1, in an embodiment, an integrated circuit device 10 includes a memory cell array 20 and a peripheral circuit 30.

The memory cell array 20 includes a plurality of memory cell blocks BLK1, BLK2, . . . , BLKn. Each of the plurality of memory cell blocks BLK1, BLK2, . . . , BLKn include a plurality of memory cells. The plurality of memory cell blocks BLK1, BLK2, . . . , BLKn are connected to the peripheral circuit 30 through a bit line BL, a word line WL, a string selection line SSL, and a ground selection line GSL.

The memory cell array 20 is connected to a page buffer 34 through the bit line BL, and is connected to a row decoder 32 through the word line WL, the string selection line SSL, and the ground selection line GSL. In the memory cell array 20, each of the plurality of memory cells in the plurality of memory cell blocks BLK1, BLK2, . . . , BLKn is a flash memory cell. The memory cell array 20 includes a three-dimensional (3D) memory cell array. The 3D memory cell array includes a plurality of NAND strings, and each of the plurality of NAND strings includes a plurality of memory cells connected to the plurality of word lines WL, which are vertically stacked.

The peripheral circuit 30 includes the row decoder 32, the page buffer 34, a data input/output (I/O) circuit 36, and a control logic 38. In addition, the peripheral circuit 30 further include various other circuits, such as a voltage generation circuit that generates various voltages that operate the integrated circuit device 10, an error correction circuit that corrects an error in data read from the memory cell array 20, an input/output interface, etc.

The peripheral circuit 30 receives an address ADDR, a command CMD, and a control signal CTRL from an external device, and transmits/receives data DATA to/from an external device.

A configuration of the peripheral circuit 30 is described in detail as follows.

The row decoder 32 selects at least one of the plurality of memory cell blocks BLK1, BLK2, . . . , BLKn in response to the address ADDR, and selects the word line WL, the string selection line SSL, and the ground selection line GSL of the selected memory cell block. The row decoder 32 transmits a voltage that performs a memory operation to the word line WL of the selected memory cell block.

The page buffer 34 is connected to the memory cell array 20 through the bit line BL. The page buffer 34 operates as a write driver during a program operation that applies a voltage to the bit line BL according to the data DATA to be stored in the memory cell array 20, and operates as a sense amplifier during a read operation that senses the data DATA stored in the memory cell array 20. The page buffer 34 operates according to a control signal PCTL received from the control logic 38.

The data input/output circuit 36 is connected to the page buffer 34 through data lines DLs. The data input/output circuit 36 receives the data DATA from a memory controller during the program operation and provides program data DATA to the page buffer 34 based on a column address C_ADDR received from the control logic 38. The data input/output circuit 36 provides the read data DATA stored in the page buffer 34 to the memory controller based on the column address C_ADDR received from the control logic 38 during a read operation. The data input/output circuit 36 transmits an input address or instruction to the control logic 38 or the row decoder 32.

The control logic 38 receives a command CMD and a control signal CTRL from the memory controller. The control logic 38 provides the row address R_ADDR to the row decoder 32 and the column address C_ADDR to the data input/output circuit 36. The control logic 38 generates various internal control signals used within the integrated circuit device 10 in response to the control signal CTRL. For example, the control logic 38 adjusts a voltage level provided to the word line WL and the bit line BL when performing a memory operation, such as a program operation or an erase operation.

Figure 2:
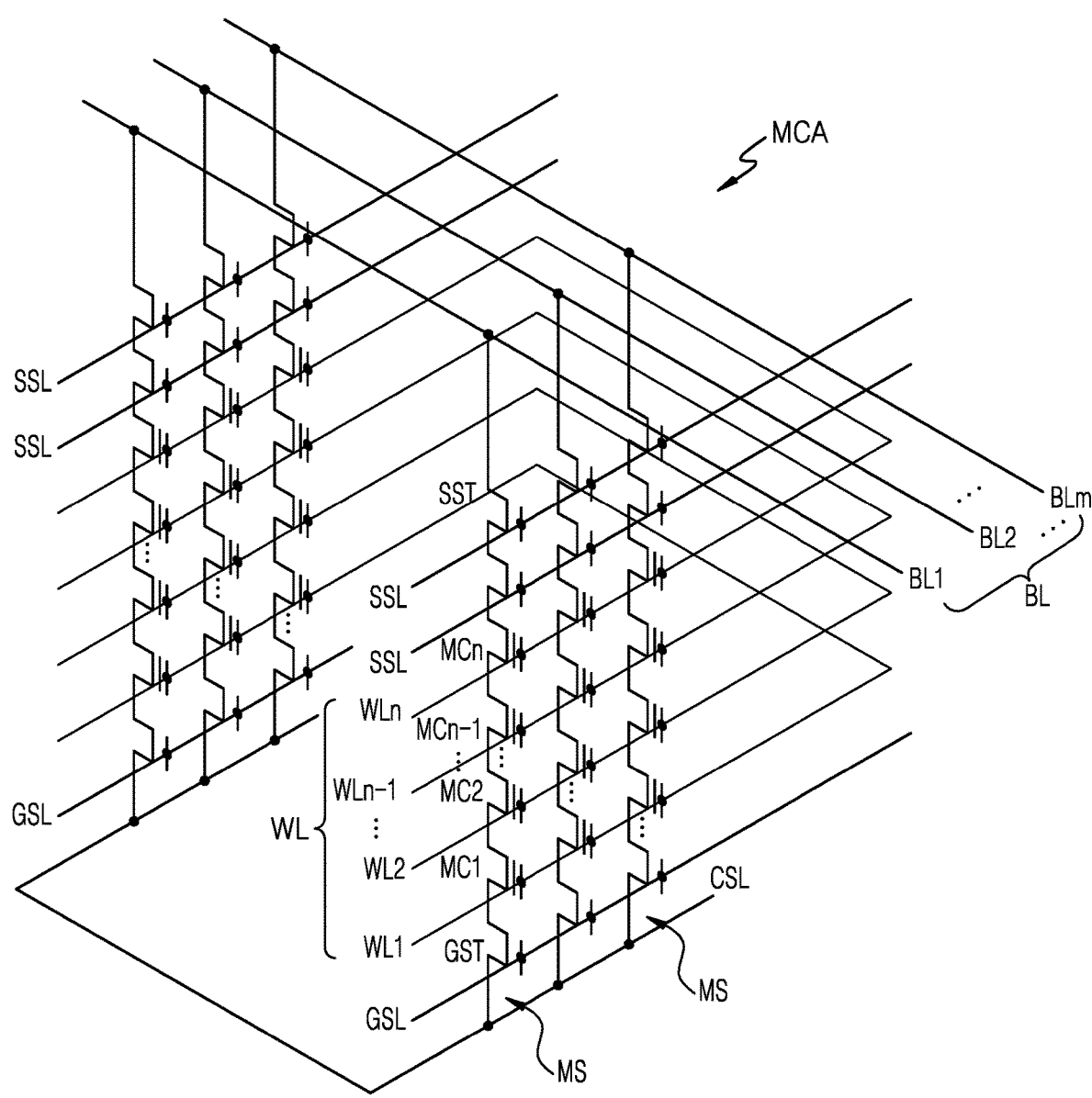
FIG. 2 is an equivalent circuit diagram of a memory cell array of an integrated circuit device according to an embodiment.

FIG. 2 is an equivalent circuit diagram of a memory cell array of an integrated circuit device according to an embodiment.

Referring to FIG. 2, in an embodiment, the equivalent circuit diagram of a vertical NAND flash memory device that has a vertical channel structure is illustrated.

A memory cell array MCA include a plurality of memory cell strings MS. The memory cell array MCA includes a plurality of bit lines BL, a plurality of word lines WL, at least one string selection line SSL, at least one ground selection line GSL, and a common source line CSL.

The plurality of memory cell strings MS are formed between the plurality of bit lines BL and the common source line CSL. Each of the plurality of memory cell strings MS includes two string selection lines SSL in the drawing, but embodiments of the inventive concept are not necessarily limited thereto. For example, in an embodiment, each of the plurality of memory cell strings MS includes one string selection line SSL.

Each of the plurality of memory cell strings MS includes a string selection transistor SST, a ground selection transistor GST, and a plurality of memory cell transistors MC1, MC2, . . . , MCn−1, MCn. A drain region of the string selection transistor SST is connected to the bit line BL, and a source region of the ground selection transistor GST is connected to the common source line CSL. Source regions of the plurality of ground selection transistors GST are commonly connected to the common source line CSL.

The string selection transistor SST is connected to the string selection line SSL, and the ground selection transistor GST is connected to the ground selection line GSL. The plurality of memory cell transistors MC1, MC2, . . . , MCn−1, MCn are respectively connected to the plurality of word lines WL.

Figure 3:
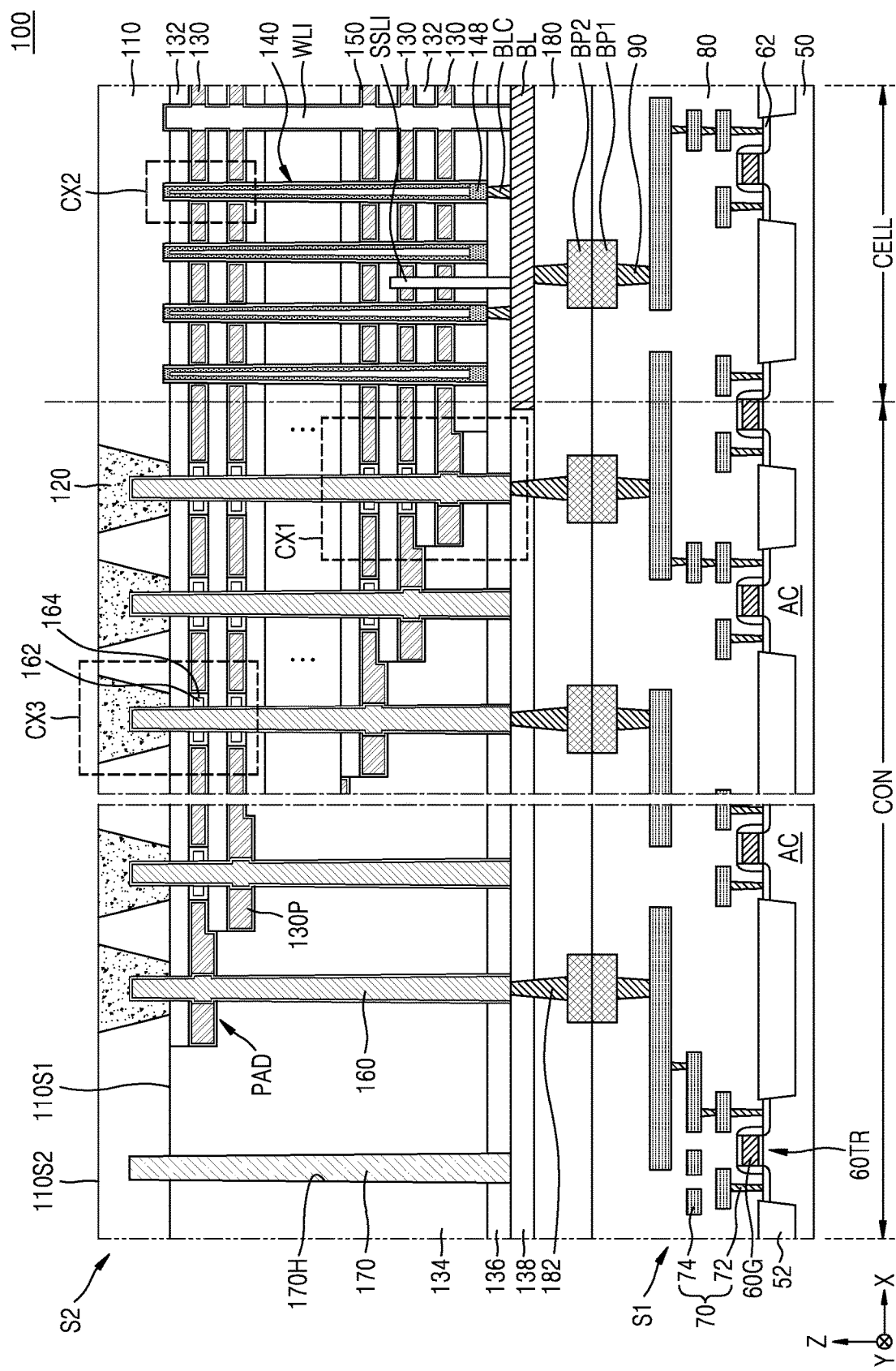
FIG. 3 is a cross sectional view of an integrated circuit device according to an embodiment.
Figure 4:
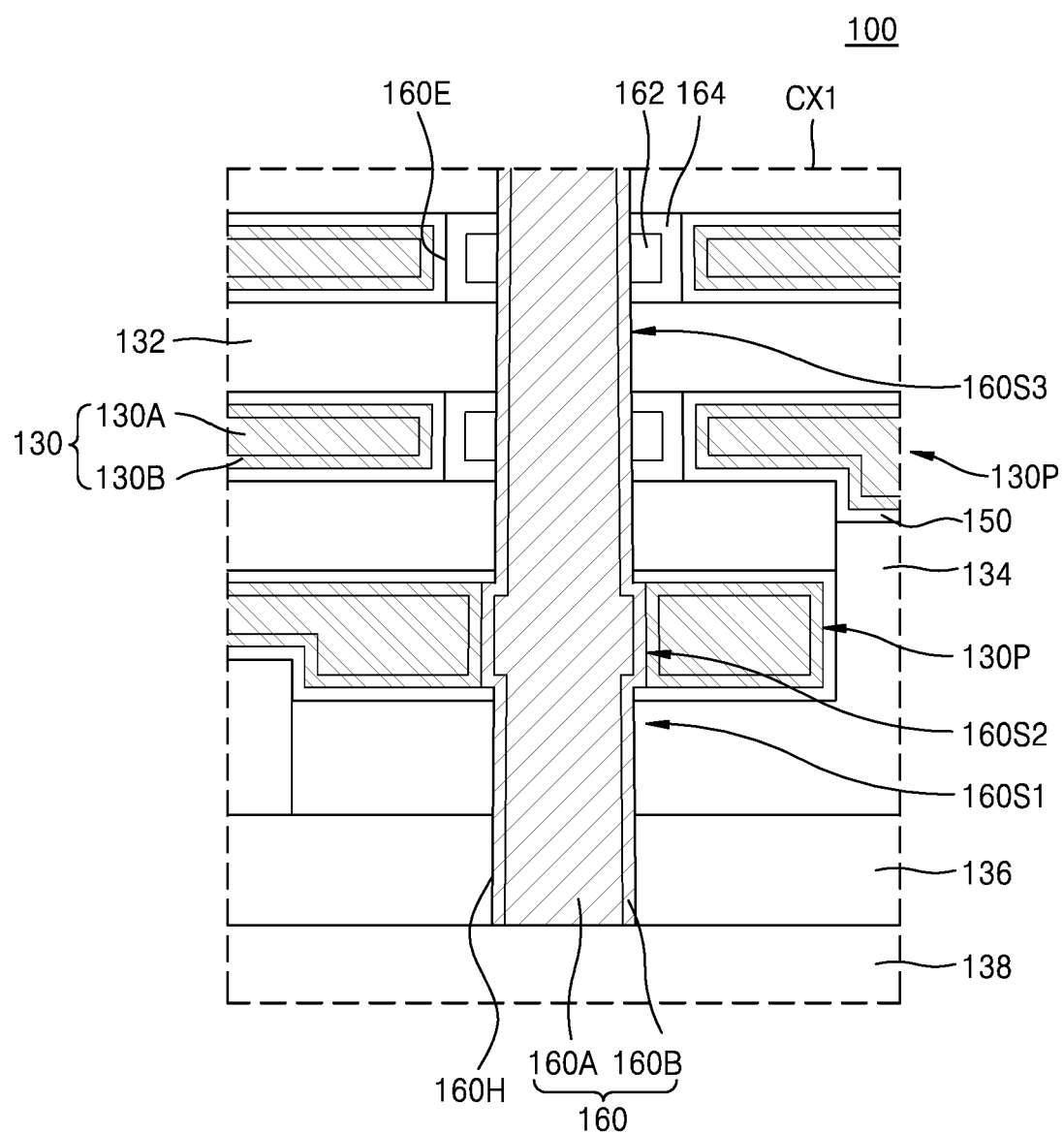
FIG. 4 is an enlarged view of a part CX1 of FIG. 3.
Figure 5:
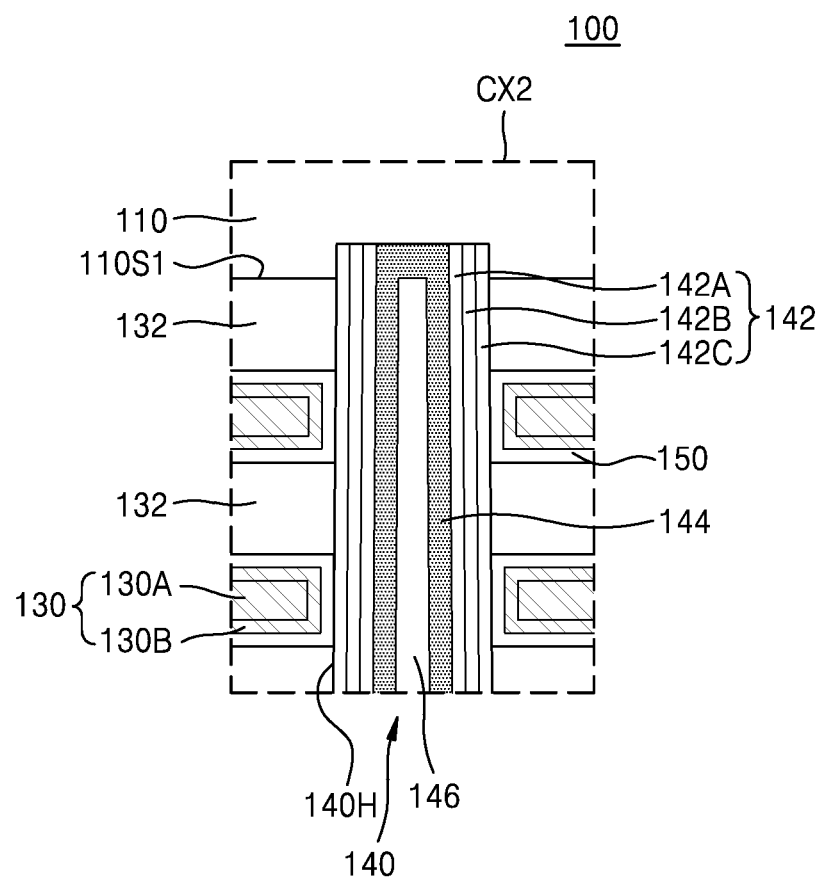
FIG. 5 is an enlarged view of a part CX2 of FIG. 3.
Figure 6:
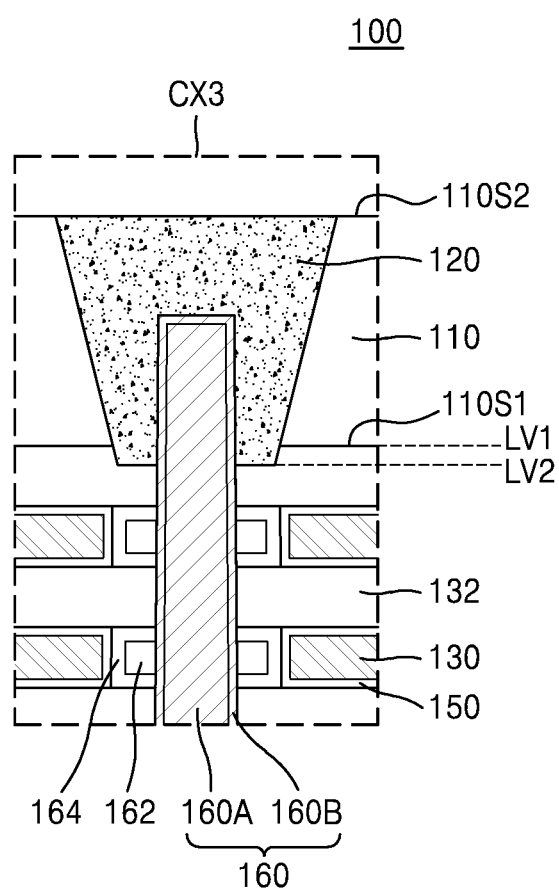
FIG. 6 is an enlarged view of a part CX3 of FIG. 3.

FIG. 3 is a cross-sectional view of an integrated circuit device according to an embodiment, FIG. 4 is an enlarged view of a part CX1 of FIG. 3, FIG. 5 is an enlarged view of a part CX2 of FIG. 3, and FIG. 6 is an enlarged view of a part CX3 of FIG. 3.

Referring to FIGS. 3 to 6 together, in an embodiment, the integrated circuit device 100 includes a first structure S1 and a second structure S2 stacked on the first structure S1.

The second structure S2 is stacked on the first structure S1 such that a plurality of first bonding pads BP1 of the first structure S1 and a plurality of second bonding pads BP2 of the second structure S2 are bonded to each other. In some embodiments, when both the first bonding pad BP1 and the second bonding pad BP2 include copper (Cu), the first structure S1 is bonded to the second structure S2 by copper (Cu)-copper (Cu) bonding.

The first structure S1 may be referred to as a peripheral circuit structure and includes the peripheral circuit 30 described with reference to FIG. 1. In addition, the second structure S2 may be referred to as a memory cell array structure and includes the memory cell array 20 described with reference to FIG. 1.

The first structure S1 includes a peripheral circuit transistor 60TR and a peripheral circuit wiring structure 70 disposed on a first substrate 50. The first substrate 50 includes a cell region CELL and a connection region CON that are horizontally arranged. An active region AC is defined by a device separation layer 52 on the first substrate 50, and the plurality of peripheral circuit transistors 60TR are formed on the active region AC. The plurality of peripheral circuit transistors 60TR include a peripheral circuit gate 60G and a source/drain region 62 disposed on the first substrate 50 on both sides of the peripheral circuit gate 60G.

The first substrate 50 includes at least one of a group IV semiconductor, a group III-V compound semiconductor, or a group II-VI oxide semiconductor, which are semiconductor materials. For example, the group IV semiconductor includes at least one of silicon (Si), germanium (Ge), or silicon-germanium. In some embodiments, the first substrate 50 is a bulk wafer or an epitaxial wafer. In some embodiments, the first substrate 50 includes one of a silicon-on-insulator (SOI) substrate or a germanium-on-insulator (GeOI) substrate.

The peripheral circuit wiring structure 70 includes a plurality of peripheral circuit contacts 72 and a plurality of peripheral circuit wiring layers 74. A first insulating layer 80 that covers the peripheral circuit transistor 60TR and the peripheral circuit wiring structure 70 is disposed on the first substrate 50. The plurality of peripheral circuit wiring layers 74 have a multilayer structure disposed at different vertical levels.

The first bonding pad BP1 are disposed on the first insulating layer 80. In some embodiments, an upper surface of the first bonding pad BP1 is coplanar with an upper surface of the first insulating layer 80. That is, the first bonding pad BP1 does not protrude from the upper surface of the first insulating layer 80. The first bonding pad BP1 include a conductive material such as at least one of copper (Cu), gold (Au), silver (Ag), aluminum (Al), tungsten (W), titanium (Ti), or tantalum (Ta), or a combination thereof.

The second structure S2 includes a plurality of gate electrodes 130 and a plurality of mold insulating layers 132 that are alternately stacked on a second substrate 110. The plurality of gate electrodes 130 and the plurality of mold insulating layers 132 may be referred to as a gate stack.

The gate electrode 130 includes a buried conductive layer 130A and a conductive barrier layer 130B that surrounds upper, lower, and side surfaces of the buried conductive layer 130A. The buried conductive layer 130A may include a metal, such as at least one of tungsten (W), nickel (Ni), cobalt (Co), or tantalum (Ta), a metal silicide, such as at least one of tungsten silicide, nickel silicide, cobalt silicide, or tantalum silicide, etc., doped polysilicon, or a combination thereof. The conductive barrier layer 130B includes at least one of titanium nitride, tantalum nitride, tungsten nitride, or a combination thereof.

In some embodiments, the plurality of gate electrodes 130 correspond to the ground selection line GSL, the word line WL, and the at least one string selection line SSL of the memory cell string MS (see FIG. 2). For example, the drawing shows that one uppermost gate electrode 130 functions as the ground selection line GSL, two lowermost gate electrodes 130 function as the string selection line SSL, and the remaining gate electrodes 130 function as the word line WL. Accordingly, the memory cell string MS is provided in which the ground selection transistor GST, the string selection transistor SST and the memory cell transistors MC1, MC2, . . . , MCn−1, MCn therebetween are connected in series.

A gate stack separation insulating layer WLI is disposed that penetrates through the gate stack. The gate stack separation insulating layer WLI includes one of silicon oxide, silicon nitride, SiON, SiOCN, SiCN, or a combination thereof.

A plurality of channel structures 140 penetrate through the gate stack and extend in the vertical direction (Z direction) in the cell region CELL. The plurality of channel structures 140 are spaced apart from each other by a predetermined distance in a first horizontal direction (X direction) and a second horizontal direction (Y direction) that crosses the first horizontal direction. The plurality of channel structures 140 may be arranged in a zigzag shape or a staggered shape.

Each of the plurality of channel structures 140 is disposed in a channel hole 140H in the cell region CELL. Each of the plurality of channel structures 140 includes a gate insulating layer 142, a channel layer 144, a buried insulating layer 146, and a conductive plug 148.

The gate insulating layer 142 and the channel layer 144 are sequentially disposed on a sidewall of the channel hole 140H. For example, the gate insulating layer 142 is conformally disposed on the sidewall of the channel hole 140H, and the channel layer 144 is conformally disposed on an inner wall of the channel hole 140H. A buried insulating layer 146 that fills the remaining space of the channel hole 140H is disposed on the channel layer 144. The conductive plug 148 is disposed on a lower side of the channel hole 140H to contact the channel layer 144 and block an entrance of the channel hole 140H. In some embodiments, the buried insulating layer 146 is omitted, and the channel layer 144 is formed in a pillar shape that fills the remaining part of the channel hole 140H.

In some embodiments, an upper surface of the channel layer 144 contacts a first side 110S1 of the second substrate 110. In some embodiments, the upper surface of the channel layer 144 extends into a second substrate 110, but embodiments are not necessarily limited thereto.

The gate insulating layer 142 includes a tunneling dielectric layer 142A, a charge storage layer 142B, and a blocking dielectric layer 142C sequentially disposed on an outer wall of the channel layer 144. The tunneling dielectric layer 142A includes at least one of silicon oxide, hafnium oxide, aluminum oxide, zirconium oxide, or tantalum oxide, etc. The charge storage layer 142B stores electrons that pass through the tunneling dielectric layer 142A from the channel layer 144, and includes at least one of silicon nitride, boron nitride, silicon boron nitride, or polysilicon doped with impurities. The blocking dielectric layer 142C includes at least one of silicon oxide, silicon nitride, or a metal oxide that has a higher dielectric constant than silicon oxide.

A dielectric liner 150 is disposed between the channel structure 140 and the gate electrode 130 and on upper and lower surfaces of the gate electrode 130. In some embodiments, the dielectric liner 150 is disposed between the conductive barrier layer 130B and the gate insulating layer 142 and between the conductive barrier layer 130B and the mold insulating layer 132. The dielectric liner 150 includes at least one of silicon oxide, silicon nitride, or a metal oxide that has a higher dielectric constant than silicon oxide.

Two lowermost gate electrodes 130 are planarly separated into two parts by a string separation insulating layer SSLI. The two parts are spaced apart from each other in the first horizontal direction (X direction) with the string separation insulating layer SSLI disposed therebetween. The two parts form the string selection line SSL described with reference to FIG. 2.

The plurality of gate electrodes 130 in the connection region CON form a pad structure PAD. In the connection region CON, the plurality of gate electrodes 130 have a length in the first horizontal direction (X direction) that decreases with increasing distance from the first side 110S1 of the second substrate 110. That is, the pad structure PAD refers to a part of the gate electrode 130 that has a stair shape. The pad structure PAD includes a plurality of conductive pads 130P that respectively extend from the plurality of gate electrodes 130 and have thicknesses in the vertical direction (Z direction) that are greater than those of the plurality of gate electrodes 130.

A cover insulating layer 134 is disposed on the pad structure PAD, and a contact insulating layer 136 is disposed on the lowermost mold insulating layer 132 and the cover insulating layer 134. In addition, the dielectric liner 150 extends from the upper and lower surfaces of the plurality of gate electrodes 130 and covers upper and lower surfaces of the conductive pad 130P.

In the connection region CON, a cell contact plug 160 is disposed inside a cell contact hole 160H that penetrates through the contact insulating layer 136, the cover insulating layer 134, the plurality of gate electrodes 130, and the plurality of mold insulating layers 132.

The cell contact plug 160 includes a buried conductive layer 160A that penetrates through the plurality of gate electrodes 130 and extends in the vertical direction (Z direction), and a conductive barrier layer 160B that surrounds side and upper surfaces of the buried conductive layer 160A. The buried conductive layer 160A may include a metal, such as at least one of tungsten (W), nickel (Ni), cobalt (Co), or tantalum (Ta), etc., a metal silicide, such as at least one of tungsten silicide, nickel silicide, cobalt silicide, or tantalum silicide, etc., doped polysilicon, or a combination thereof. For example, the conductive barrier layer 160B includes one of titanium nitride, tantalum nitride, tungsten nitride, or a combination thereof.

The cell contact plug 160 is electrically connected to the conductive pad 130P that corresponds thereto, and is insulated from at least one of the plurality of gate electrodes 130 disposed at a higher vertical level than the conductive pad 130P.

The cell contact plug 160 includes a vertical portion that extends in the vertical direction (Z direction) and a protruding portion that protrudes from the vertical portion in the horizontal direction (X or Y direction). The protruding portion contacts a sidewall of the conductive pad 130P and is electrically connected to the sidewall of the conductive pad 130P.

For example, the cell contact plug 160 includes a lower sidewall portion 160S1, a protruding sidewall portion 160S2, and an upper sidewall portion 160S3, and the protruding sidewall portion 160S2 is the protruding portion that contacts a conductive pad 130P that corresponds to the cell contact plug 160. The lower sidewall portion 160S1 is located at a lower vertical level than the protruding sidewall portion 160S2 and is surrounded by the cover insulating layer 134 and the contact insulating layer 136. The upper sidewall portion 160S3 is located at a higher vertical level than the protruding sidewall portion 160S2.

The upper sidewall portion 160S3 of the cell contact plug 160 is surrounded by the plurality of mold insulating layers 132 and a plurality of insulating ring patterns 162. The plurality of insulating ring patterns 162 and an insulating liner 164 are disposed between the upper sidewall portion 160S3 of the cell contact plug 160 and the plurality of gate electrodes 130. For example, the insulating liner 164 is conformally disposed on an inner wall of an extending portion 160E of the cell contact hole 160H, and each insulation ring pattern 162 is disposed on the insulating liner 164 and fills the inside of the extending portion 160E.

The dielectric liner 150 surrounds the upper and lower surfaces of the conductive pad 130P and extends to the protruding sidewall portion 160S2 of the cell contact plug 160. The dielectric liner 150 extends relatively close to the cell contact hole 160H.

The lowermost part of the cell contact plug 160 contacts a second bonding via 182, and the second bonding via 182 is covered by an interlayer insulating layer 180. A lower surface of the second bonding via 182 contacts an upper surface of the second bonding pad BP2. The second bonding via 182 includes polysilicon doped with impurities.

An upper part of the cell contact plug 160 contact a node separation structure 120 in the second substrate 110. The node separation structure 120 penetrates through the second substrate 110. The node separation structure 120 is made of an insulating material, such as silicon oxide, silicon nitride, etc. The node separation structure 120 is described in detail below.

In the connection region CON, a through hole 170H is formed that penetrates through the cover insulating layer 134 and the contact insulating layer 136, and a conductive through via 170 is disposed in the through hole 170H. The conductive through via 170 includes one of tungsten (W), titanium (Ti), tantalum (Ta), copper (Cu), aluminum (Al), titanium nitride, tantalum nitride, tungsten nitride, or a combination thereof.

In the connection region CON, the cell contact plug 160 is connected to the first structure S1 through the second bonding via 182 and the second bonding pad BP2. In addition, the cell contact plug 160 is electrically connected to the peripheral circuit transistor 60TR through a first bonding via 90 and the first bonding pad BP1 of the first structure S1.

In the cell region CELL, a bit line contact BLC penetrates through the contact insulating layer 136 and contact the conductive plug 148 of the channel structure 140, and the bit line BL is disposed on the bit line contact BLC. A line insulating layer 138 that covers a sidewall of the bit line BL is disposed on the contact insulating layer 136.

As described above, in the integrated circuit device 100 according to an embodiment of the inventive concept, the node separation structure 120 that penetrates through the second substrate 110 has an inverted trapezoidal shape that surrounds the upper part of the cell contact plug 160 positioned in the second substrate 110. The node separation structure 120 insulates a plurality of cell contact plugs 160 from the second substrate 110.

A vertical thickness of the node separation structure 120 is greater than a vertical thickness of the second substrate 110. For example, a level LV2 of the lowermost surface of the node separation structure 120 is lower than a level LV1 of the first side 110S1 of the second substrate 110, and a level of the uppermost surface of the node separation structure 120 is at substantially the same level as a second side 110S2 of the second substrate 110. For example, the uppermost surface of the node separation structure 120 is coplanar with the second side 110S2 of the second substrate 110.

According to a structure of the integrated circuit device 100, each of the cell contact plug 160 and the second bonding via 182 has a horizontal width that increases with decreasing distance in the vertical direction (Z direction) from the first substrate 50. In contrast, the node separation structure 120 has a horizontal width that decreases with decreasing distance in the vertical direction (Z direction) from the first substrate 50.

In general, a vertical memory device that has a 3D structure is developed to increase the number of stack stages of the gate electrode 130 to achieve a high degree of integration. Accordingly, the challenge of a high aspect ratio contact (HARC) etching process increases. In particular, when an HARC formed by the HARC etching process needs to be in constant contact with a landing pad, the landing pad should be larger to secure a safety margin. Paradoxically, this situation causes a deterioration of the degree of integration of the memory device.

To address this situation, the integrated circuit device 100 according to an embodiment of the inventive concept does not include the landing pad, by designing the upper part of the cell contact plug 160, which is located at the end of the HARC etching process and penetrates through the plurality of gate electrodes 130 and extends in the vertical direction (Z direction), to contact the second substrate 110, and by designing the lower part of the cell contact plug 160, which is located at the start of the HARC etching process, to contact the second bonding via 182. That is, the cell contact plug 160 is electrically connected to a peripheral circuit structure through the second bonding via 182.

In addition, in the integrated circuit device 100 according to an embodiment of the inventive concept, a contact resistance due to contact between the second substrate 110 and the cell contact plug 160 is effectively increased by forming the node separation structure 120 in the second substrate 110.

To overcome the limitations of a general HARC etching process, the integrated circuit device 100 according to an embodiment of the inventive concept utilizes a bonding structure in which the vertical memory device structure and the peripheral circuit structure are bonded to each other, and thus, the integration degree and economic feasibility of the integrated circuit device 100 are increased.

Figure 7:
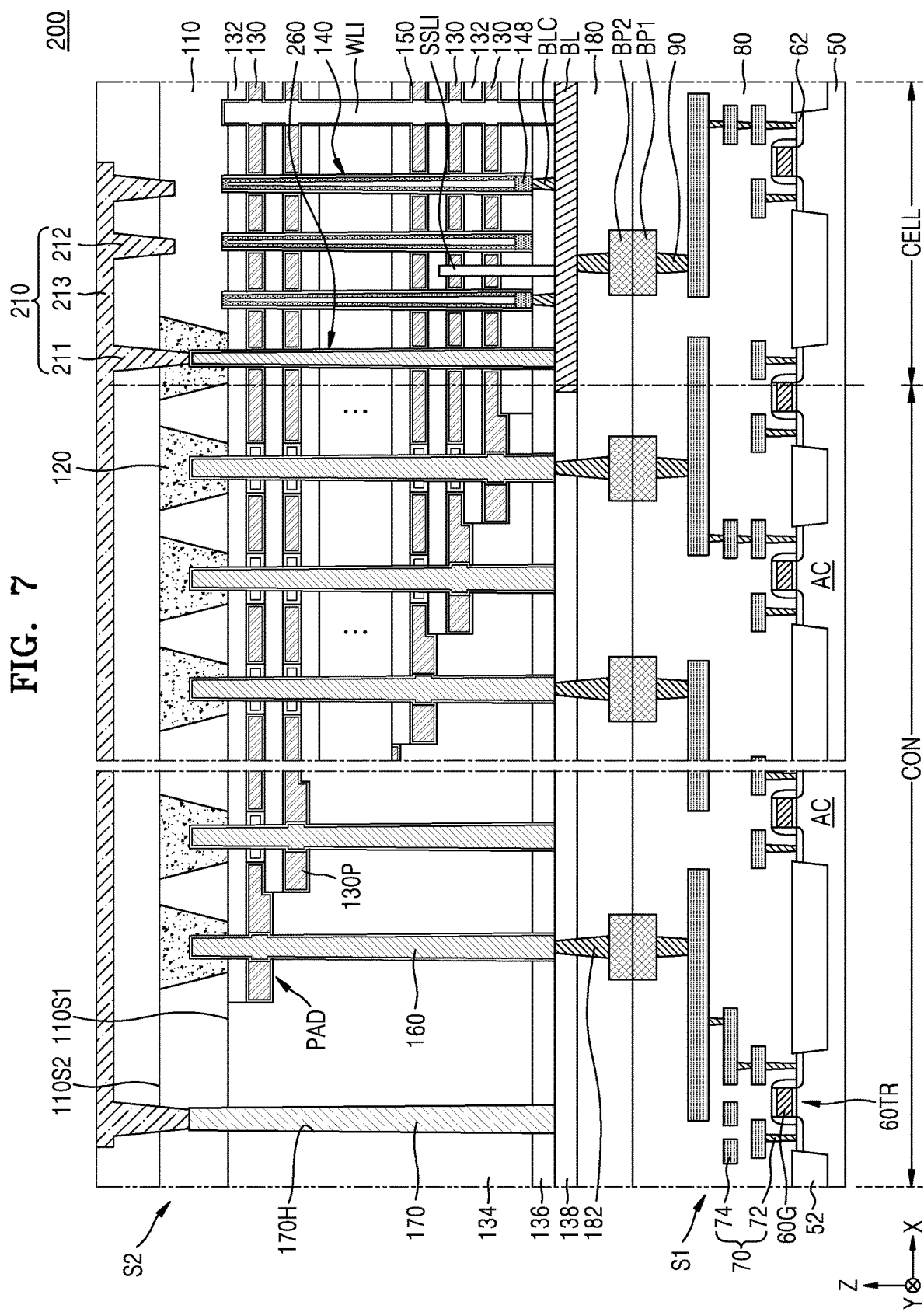
FIGS. 7 and 8 are cross-sectional views of an integrated circuit device according to an embodiment.
Figure 8:
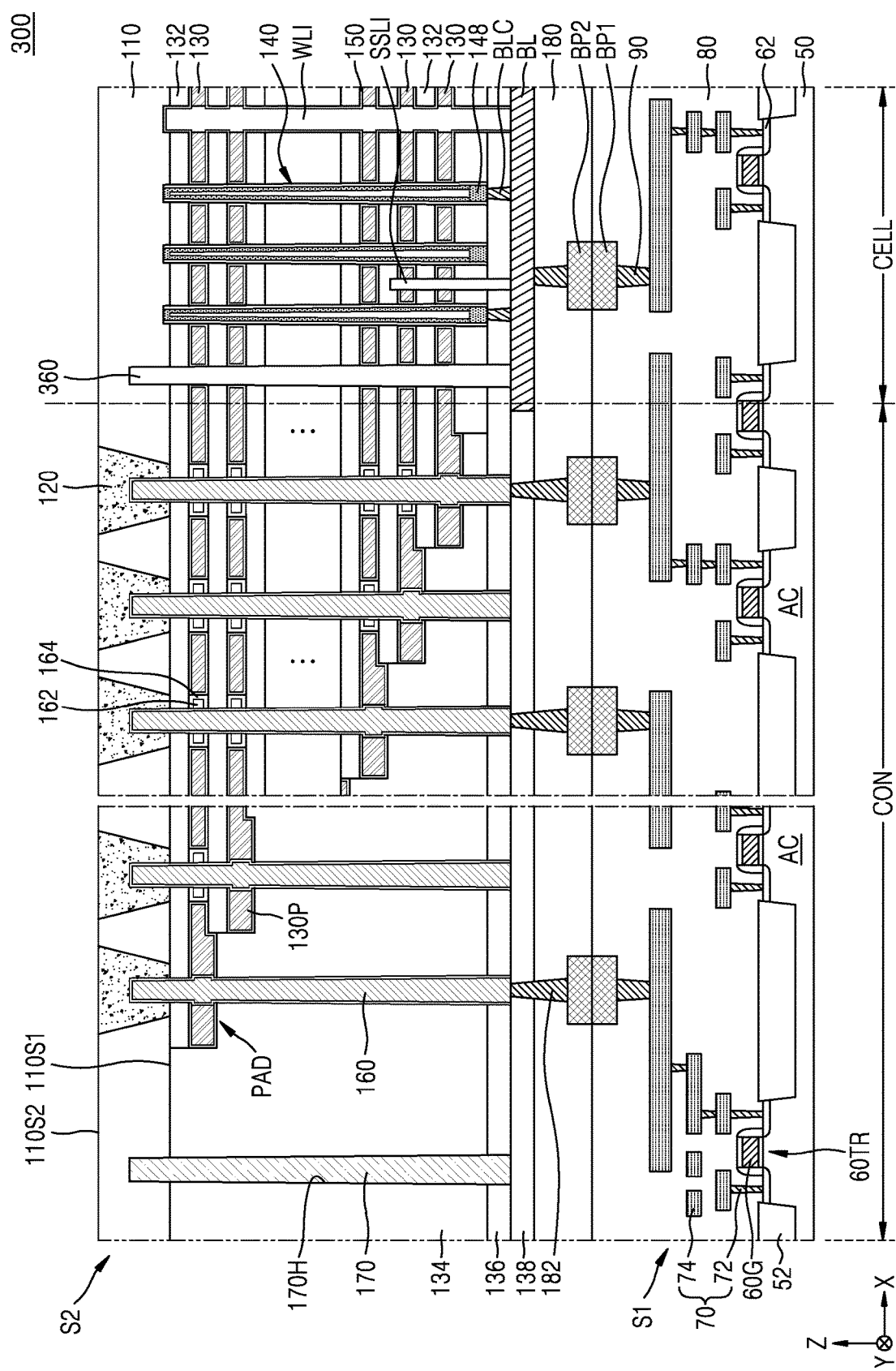

FIGS. 7 and 8 are cross-sectional views of an integrated circuit device according to another embodiment.

Most components of integrated circuit devices 200 and 300 described below and materials of the components are substantially the same as or similar to the integrated circuit device 100 described with reference to FIGS. 3 to 6 above. Therefore, for convenience of description, differences between the integrated circuit devices 200 and 300 and the integrated circuit device 100 described above are mainly described.

Referring to FIG. 7, in an embodiment, the integrated circuit device 200 includes the first structure S1 and the second structure S2 stacked on the first structure S1.

The integrated circuit device 200 of an example of the present embodiment includes a common source line contact 260 disposed in the cell region CELL and that penetrates through the plurality of gate electrodes 130 in the vertical direction (Z direction) and a contact structure 210 disposed on the second side 110S2 of the second substrate 110. In an embodiment, an uppermost surface of the common source line contact 260 is coplanar with an uppermost surface of the cell contact plug 160, and a lowermost surface of the common source line contact 260 is coplanar with a lowermost surface of the cell contact plug 160.

The contact structure 210 includes a first vertical contact 211 in contact with an upper part of the common source line contact 260, a second vertical contact 212 in contact with the second side 110S2 of the second substrate 110, and a horizontal connection conductive layer 213 that connects the first vertical contact 211 to the second vertical contact 212 in the horizontal direction (X or Y direction). In some embodiments, a part of the first vertical contact 211 is in contact with the conductive through via 170.

Each of the node separation structure 120, the first vertical contact 211, and the second vertical contact 212 have a horizontal width that decreases with decreasing distance in the vertical direction (Z direction) to the first substrate 50. Each of a plurality of cell contact plugs 160 and the common source line contact 260 has a horizontal width that increases with decreasing distance in the vertical direction to the first substrate 50.

Referring to FIG. 8, in an embodiment, the integrated circuit device 300 includes the first structure S1 and the second structure S2 stacked on the first structure S1.

The integrated circuit device 300 of an example of the present embodiment includes an insulating through support 360 disposed in the cell region CELL and that penetrates through the plurality of gate electrodes 130 in the vertical direction (Z direction).

The insulating through support 360 prevents inclination or bending of the gate electrode 130 in a manufacturing process of the integrated circuit device 300, and secures structural stability. The insulating through support 360 includes at least one of silicon oxide, silicon nitride, SiON, SiOCN, SiCN, or a combination thereof.

The insulating through support 360 has a structure and shape that are similar to those of the cell contact plug 160. For example, the uppermost surface of the insulating through support 360 is coplanar with the uppermost surface of the cell contact plug 160, and the lowermost surface of the insulating through support 360 is coplanar with the lowermost surface of the cell contact plug 160. In addition, the second substrate 110 surrounds the upper part of the insulating through support 360.

However, the insulating through support 360 is made of an insulating material, and the cell contact plug 160 is made of a conductive material.

FIGS. 9A to 9I are cross-sectional views that sequentially illustrate a method of manufacturing an integrated circuit device, according to an embodiment.

Figure 9A:
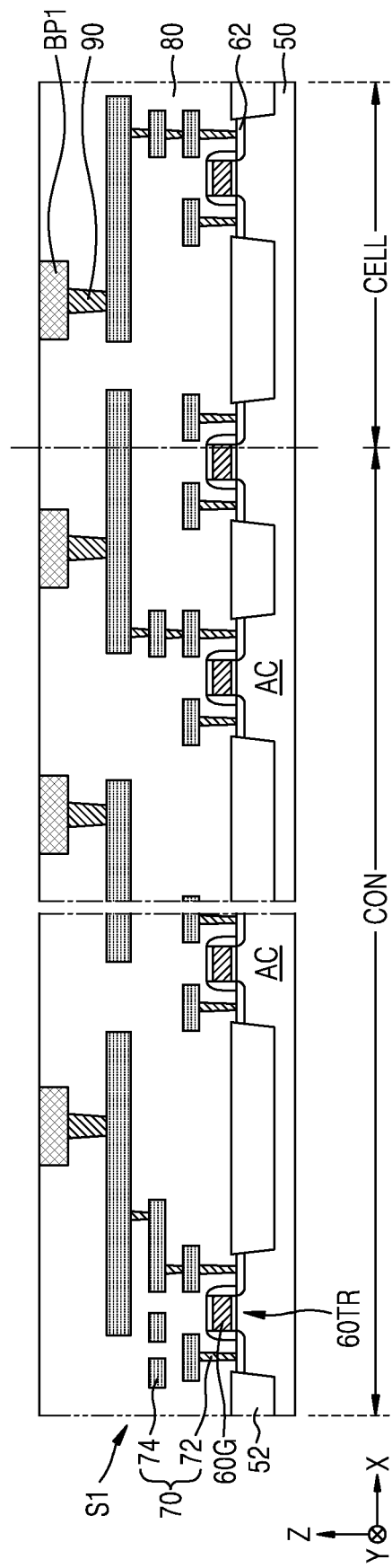

Referring to FIG. 9A, in an embodiment, the first structure S1, which includes the first substrate 50, is formed.

In some embodiments, the first substrate 50 is a silicon (Si) wafer. A plurality of peripheral circuit transistors 60TR are formed on the first substrate 50, and the peripheral circuit wiring structure 70 and the first insulating layer 80 electrically connected to the peripheral circuit transistor 60TR are formed.

The first bonding pad BP1 is disposed on the first insulating layer 80. In some embodiments, an upper surface of the first bonding pad BP1 is coplanar with an upper surface of the first insulating layer 80. For example, the first bonding pad BP1 does not protrude from the upper surface of the first insulating layer 80.

The first bonding pad BP1 are electrically connected to the peripheral circuit wiring structure 70 through the first bonding via 90.

Referring to FIG. 9B, in an embodiment, a plurality of mold insulating layers 132 and a plurality of sacrificial layers S130 are alternately formed on the first side 110S1 of the second substrate 110.

In some embodiments, the plurality of mold insulating layers 132 include an insulating material, such as silicon oxide or silicon oxynitride, and the plurality of sacrificial layers S130 include at least one of silicon nitride, silicon oxynitride, polysilicon, etc.

Figure 9C:
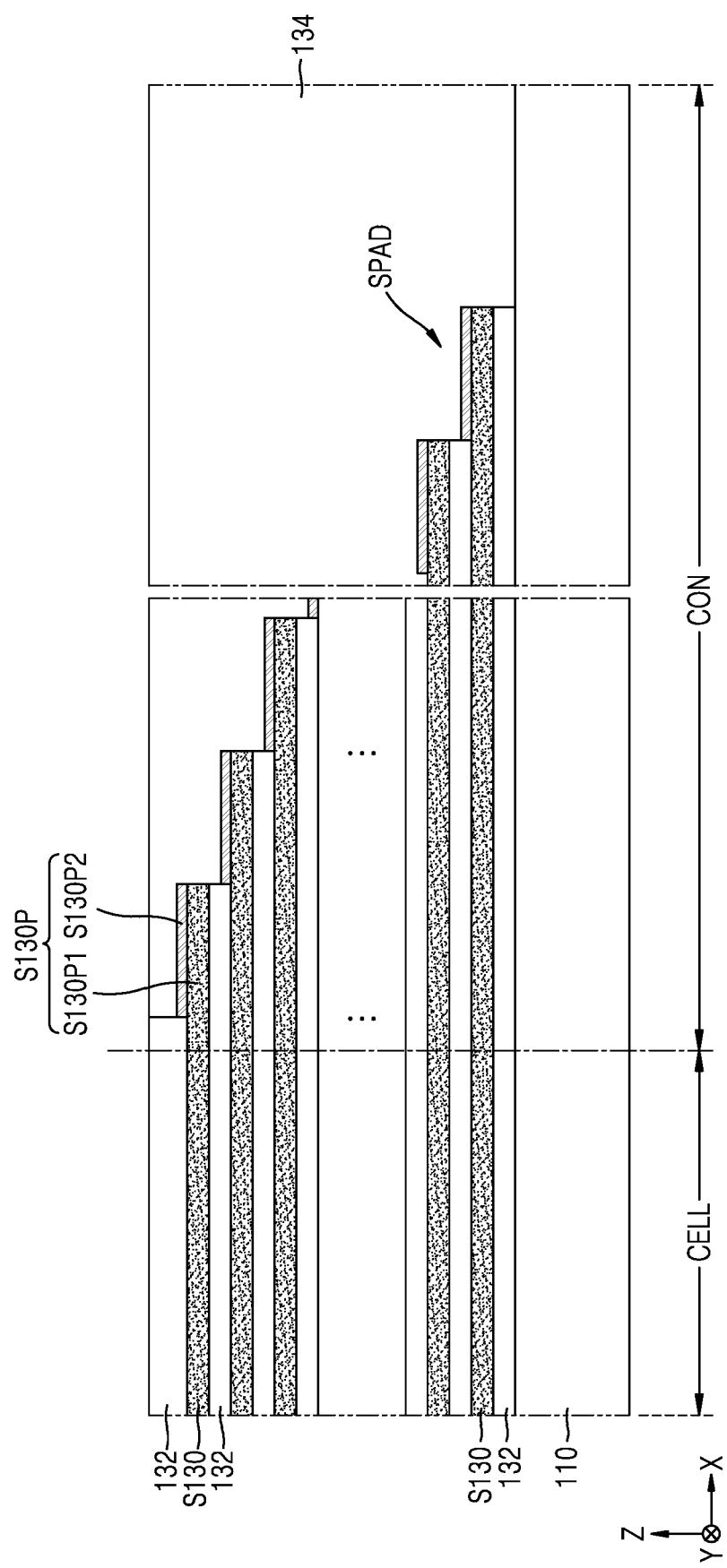

Referring to FIG. 9C, in an embodiment, a preliminary pad structure SPAD is formed, by sequentially patterning the plurality of mold insulating layers 132 and the plurality of sacrificial layers S130 in the connection region CON.

In some embodiments, the preliminary pad structure SPAD has a stair shape in which upper surface levels step down in the vertical direction (Z direction) as the preliminary pad structure SPAD extends in the first horizontal direction (X direction). For example, the preliminary pad structure SPAD includes a plurality of preliminary pad portions S130P, and each of the plurality of preliminary pad portions S130P includes a first preliminary pad layer S130P1 and a second preliminary pad layer S130P2.

In some embodiments, the first preliminary pad layer S130P1 refers to edges of the plurality of sacrificial layers S130, and accordingly, the first preliminary pad layer S130P1 includes the same insulating material as the plurality of sacrificial layers S130. The second preliminary pad layer S130P2 includes a material that has an etch selectivity with respect to the first preliminary pad layer S130P1. In some embodiments, the first preliminary pad layer S130P1 includes silicon nitride, and the second preliminary pad layer S130P2 includes silicon oxynitride.

The cover insulating layer 134 that covers the preliminary pad structure SPAD is formed. The cover insulating layer 134 includes an insulating material, such as one of silicon oxide or silicon oxynitride.

Figure 9D:
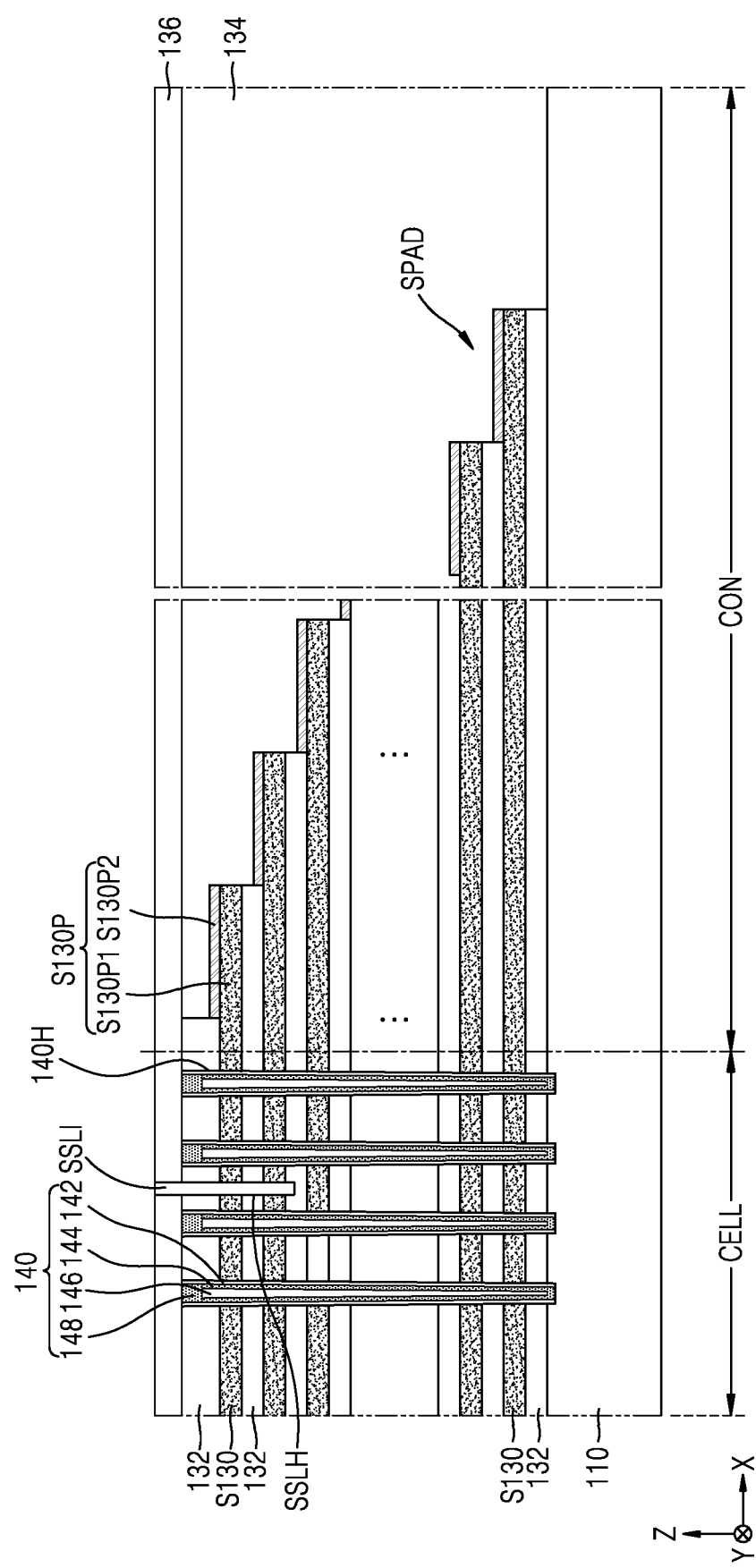

Referring to FIG. 9D, in an embodiment, a mask pattern is formed on the uppermost mold insulating layer 132 and the cover insulating layer 134, and the channel hole 140H is formed by patterning the plurality of mold insulating layers 132 and the plurality of sacrificial layers S130 by using the mask pattern as an etch mask.

The channel structure 140, which includes the gate insulating layer 142, the channel layer 144, the buried insulating layer 146, and the conductive plug 148, is formed on an inner wall of the channel hole 140H.

The contact insulating layer 136, which covers the uppermost mold insulating layer 132, the cover insulating layer 134, and the channel structure 140, is formed.

A string separation opening SSLH is formed in the cell region CELL by removing the contact insulating layer 136, the two uppermost sacrificial layers S130, and the two uppermost mold insulating layers 132, and the string separation insulating layer SSLI that fills the inside of the string separation opening SSLH is formed by using an insulating material.

Figure 9E:
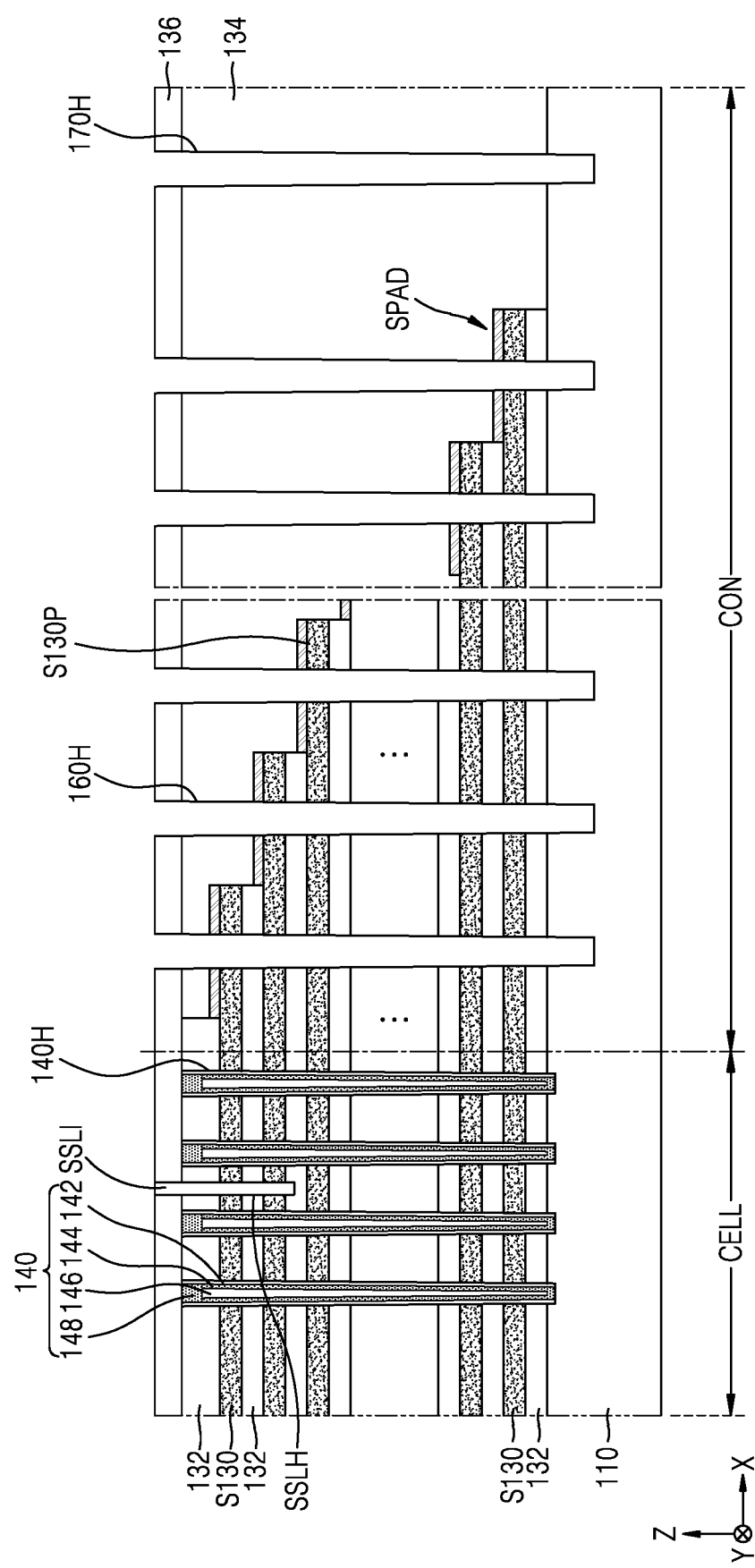

Referring to FIG. 9E, a mask pattern is formed on the contact insulating layer 136 in the connection region CON, and the plurality of cell contact holes 160H that penetrate through the contact insulating layer 136 and the preliminary pad structure SPAD are formed by using the mask pattern as an etch mask.

In some embodiments, the through hole 170H that penetrates through the contact insulating layer 136 and the cover insulating layer 134 is formed in the connection region CON by using the mask pattern as the etch mask.

The cell contact hole 160H extends in the vertical direction (Z direction) and penetrates through the preliminary pad portion S130P, through the plurality of sacrificial layers S130 and the plurality of mold insulating layers 132 that are located below the preliminary pad portion S130P. For example, the cell contact hole 160H extends in the vertical direction (Z direction) from the upper surface of the contact insulating layer 136 to the interior of the second substrate 110.

Figure 9F:
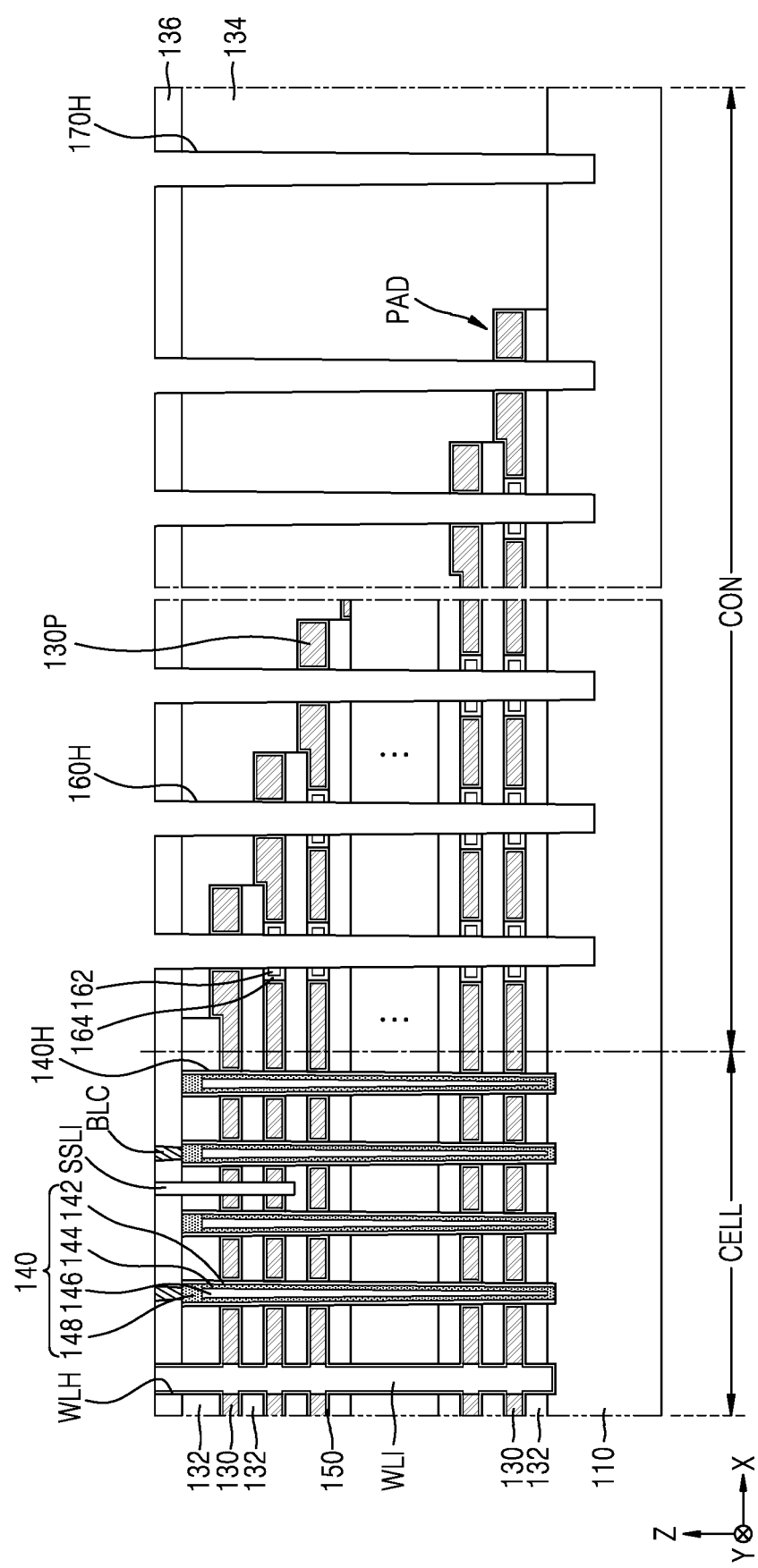

Referring to FIG. 9F, in an embodiment, the insulating ring pattern 162 and the insulating liner 164 that fill the extending portion 160E are formed inside the cell contact hole 160H.

In some embodiments, the insulating liner 164 is conformally formed on an inner wall of the extending portion 160E of the cell contact hole 160H, and each insulation ring pattern 162 fills the inside of the extending portion 160E on the insulating liner 164.

A mask pattern is formed on the contact insulating layer 136, and a gate stack separation opening WLH is formed by removing some of the plurality of mold insulating layers 132 and some of the plurality of sacrificial layers S130 by using the mask pattern as the etch mask. Accordingly, the plurality of sacrificial layers S130 are exposed on an inner wall of the gate stack separation opening WLH.

The plurality of sacrificial layers S130 exposed on the sidewall of the gate stack separation opening WLH are removed and a plurality of gate spaces are formed. A removal process of the plurality of sacrificial layers S130 may be a wet etching process that uses a phosphoric acid solution. As the plurality of sacrificial layers S130 are removed, a part of the sidewall of the channel structure 140 is exposed.

The plurality of gate electrodes 130 are formed by burying a conductive material in the plurality of gate spaces. In addition, the conductive pad (PAD) 130P is formed by burying the conductive material in a pad portion space.

Figure 9G:
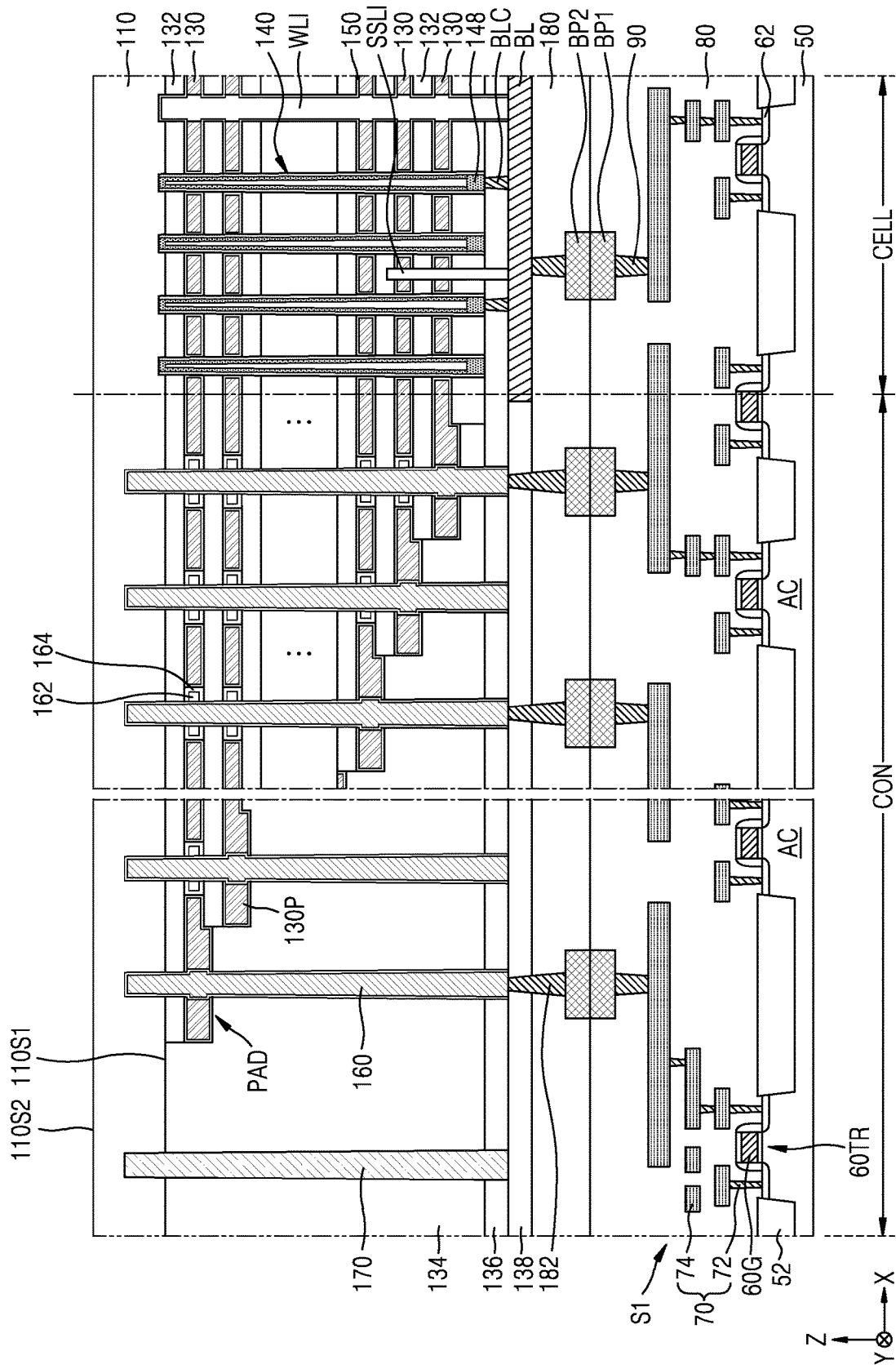

Referring to FIG. 9G, in an embodiment, a conductive layer is formed that fills the inside of the cell contact hole 160H and the through hole 170H, an upper part of the conductive layer is planarized so that the upper surface of the contact insulating layer 136 is exposed, and the cell contact plug 160 and the conductive through via 170 are formed in the cell contact hole 160H and the through hole 170H, respectively.

The plurality of second bonding vias 182, which are respectively connected to the plurality of cell contact plugs 160, and the plurality of second bonding pads BP2, which are respectively connected to the plurality of second bonding vias 182, are formed.

A resultant on which the plurality of second bonding pads BP2 are formed is turned upside down and bonded onto the first structure S1. For example, the resultant is bonded onto the first structure S1 such that the plurality of second bonding pads BP2 of the resultant respectively correspond to the plurality of first bonding pads BP1 of the first structure S1.

In some embodiments, the plurality of first bonding pads BP1 and the plurality of second bonding pads BP2 that correspond to each other are heated to expand and come into contact with each other, and then are diffusion bonded through diffusion of metal atoms therein.

Figure 9H:
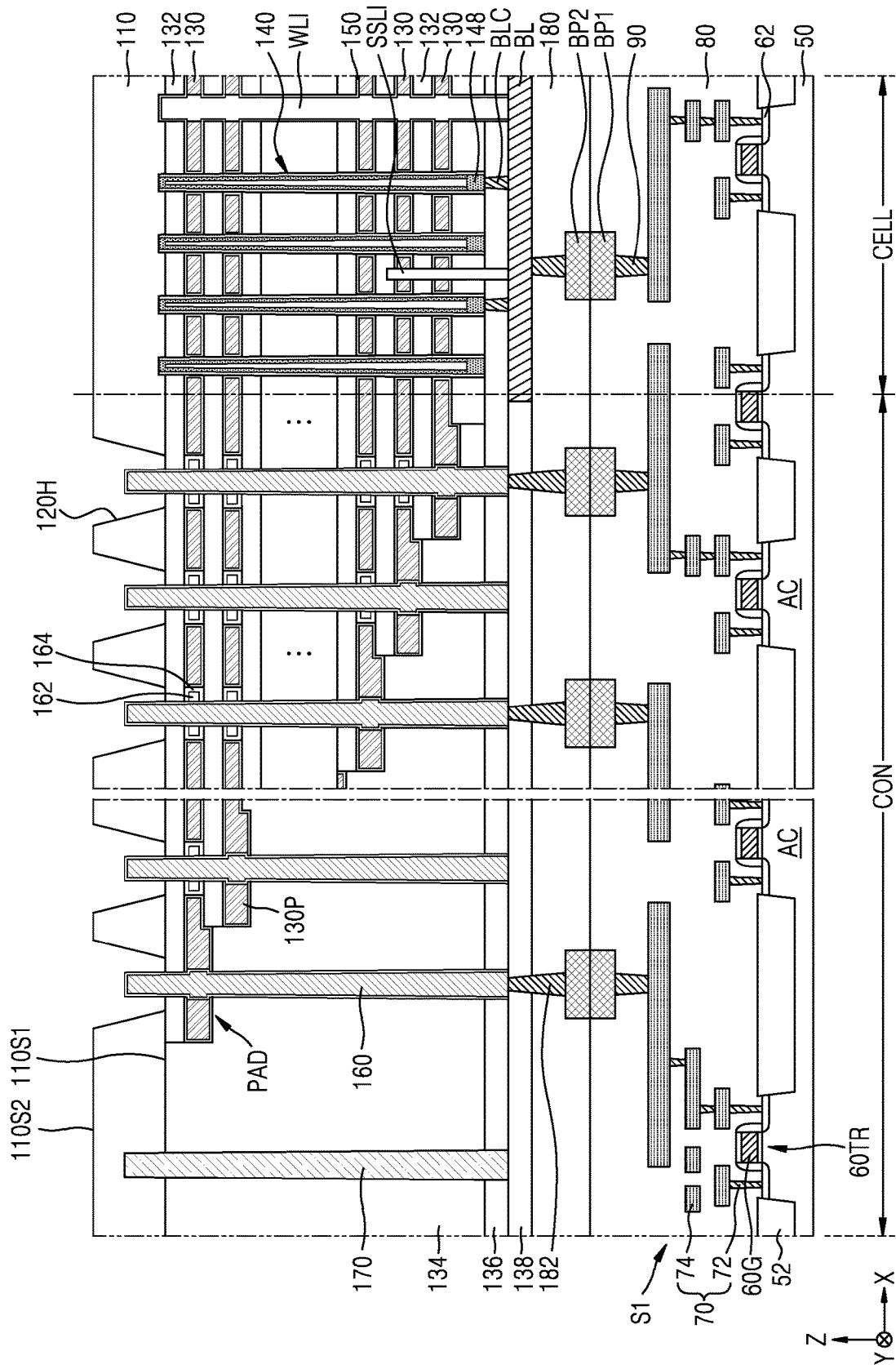

Referring to FIG. 9H, in an embodiment, a mask pattern is formed on the second side 110S2 of the second substrate 110 in the connection region CON, and a node separation hole 120H is formed by using the mask pattern as an etch mask so that an upper part of the cell contact plug 160 and an upper surface of the mold insulating layer 132 are exposed.

In some embodiments, the node separation hole 120H, which penetrates through the second substrate 110, is formed with an inverted trapezoidal shape to surround the upper part of the cell contact plug 160 in the second substrate 110.

According to such a manufacturing process, the cell contact plug 160 is formed to have a horizontal width that increases with decreasing distance in the vertical direction to the first substrate 50, and the node separation hole 120H is formed to have a horizontal width that decreases with decreasing distance in the vertical direction to the first substrate 50.

Figure 9I:
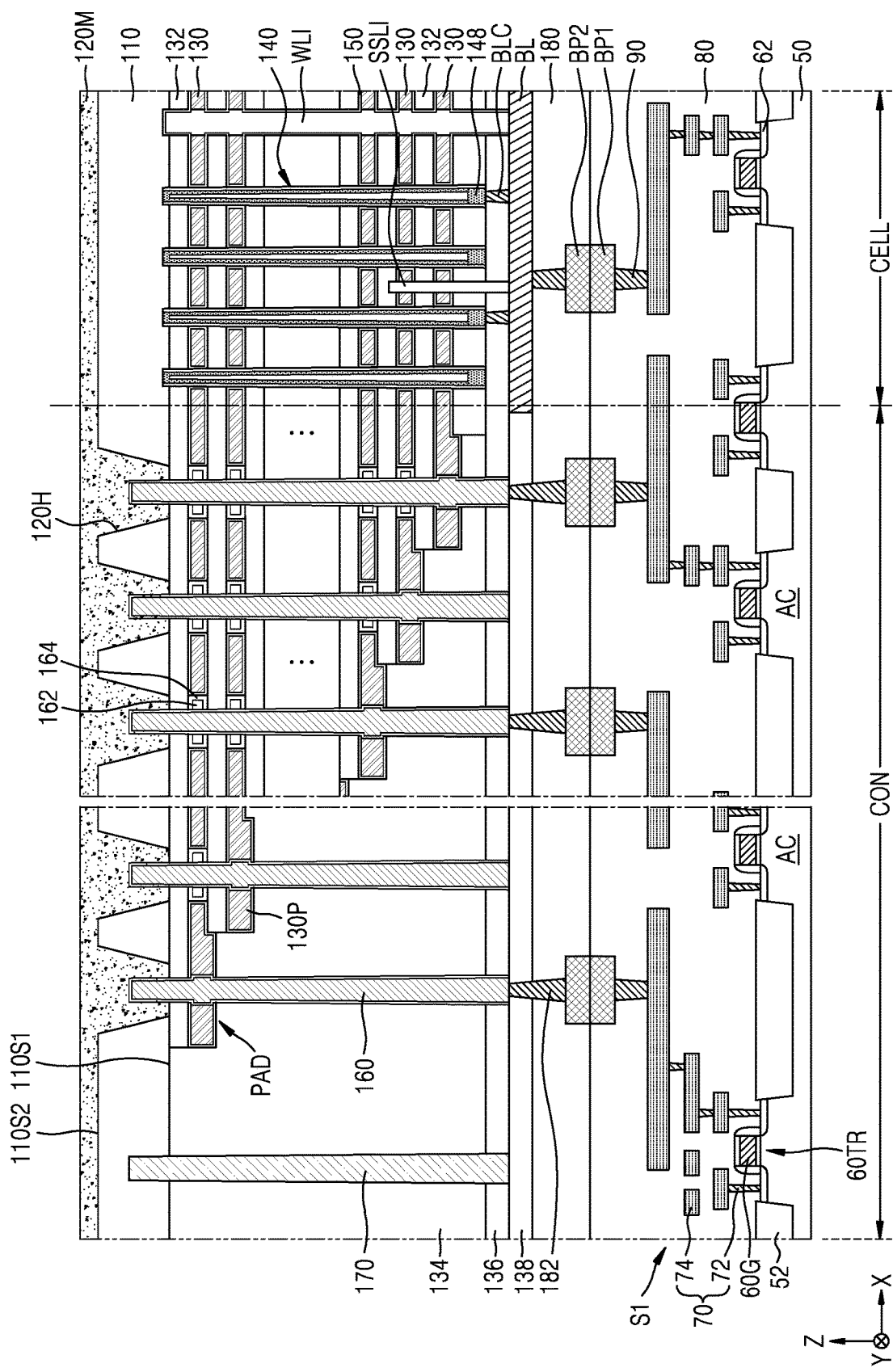

Referring to FIG. 9I, in an embodiment, the node separation material layer 120M is formed that fills all of the plurality of node separation holes 120H and covers the second side 110S2 of the second substrate 110.

In some embodiments, the node separation material layer 120M includes an insulating material, such as at least one of silicon oxide, silicon nitride, etc. The node separation material layer 120M completely surrounds the upper part of the cell contact plug 160 in the second substrate 110 and completely covers the second side 110S2 of the second substrate 110.

Referring back to FIG. 3, in an embodiment, the node separation material layer 120M is etched by a planarization process, such as a chemical mechanical polishing (CMP) process or an etch-back process, and separated into the node separation structure 120, and thus, the integrated circuit device 100 is completed.

To overcome the limitations of a general HARC etching process, the integrated circuit device 100 according to an embodiment of the inventive concept that is formed by the above-described manufacturing process utilizes the characteristics of a bonding structure in which a vertical memory device structure and a peripheral circuit structure are bonded to each other, and thus, the integration degree and economic feasibility of the integrated circuit device 100 are increased.

Figure 10:
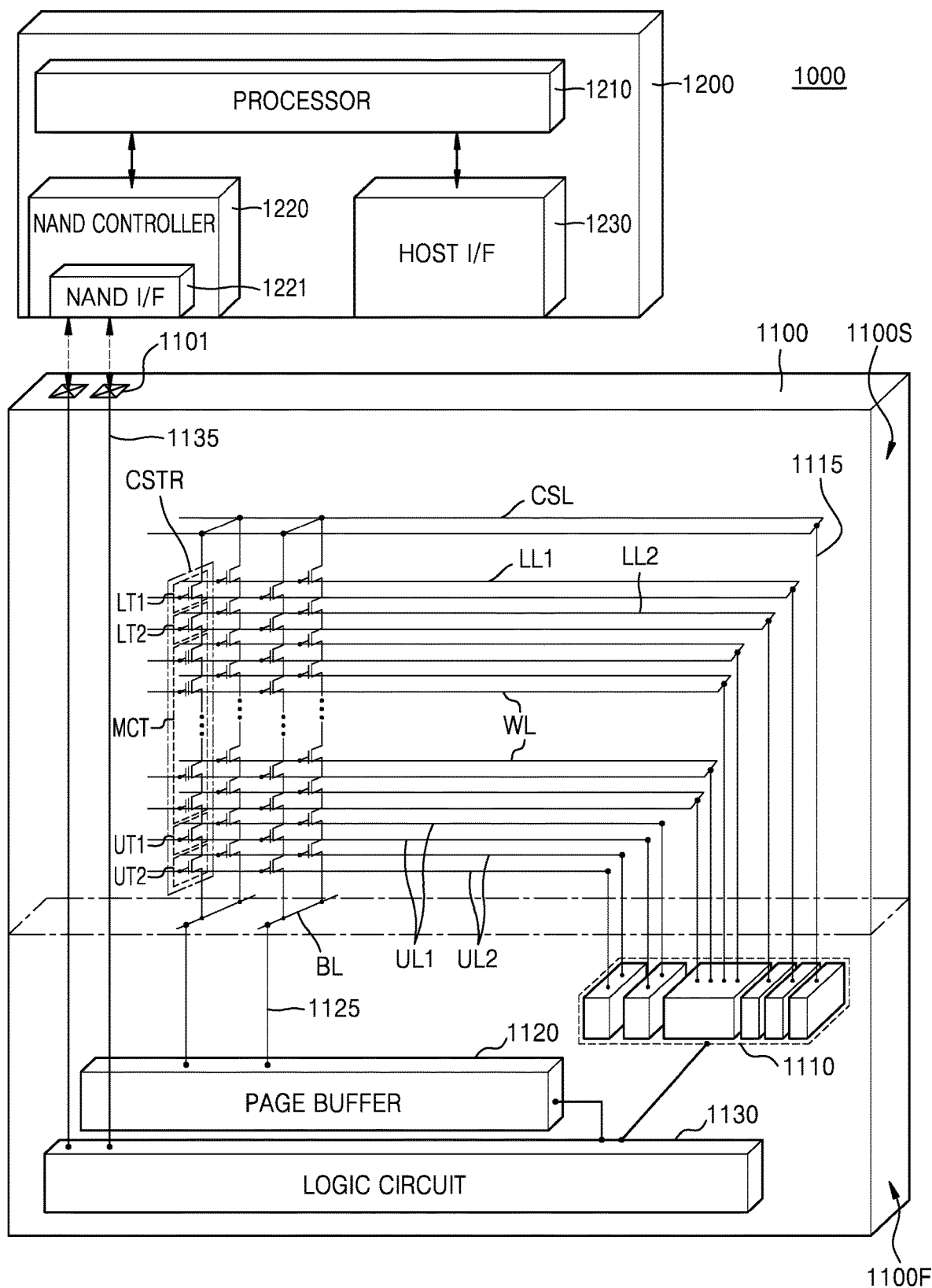
FIG. 10 illustrates an electronic system that includes an integrated circuit device according to an embodiment.

FIG. 10 illustrates an electronic system that includes an integrated circuit device according to an embodiment.

Referring to FIG. 10, an electronic system 1000 according to an embodiment of the inventive concept includes an integrated circuit device 1100 and a controller 1200 electrically connected to the integrated circuit device 1100.

The electronic system 1000 may be a storage device that includes one or a plurality of integrated circuit devices 1100 or an electronic device that includes the storage device. For example, the electronic system 1000 may be one of a solid state drive (SSD) device that includes at least one integrated circuit device 1100, a universal serial bus (USB) device, a computing system, a medical device, or a communication device.

The integrated circuit device 1100 is a nonvolatile vertical memory device. For example, the integrated circuit device 1100 may be a NAND flash memory device that includes at least one of the integrated circuit devices 100, 200, and 300 described above with reference to FIGS. 3 to 8. The integrated circuit device 1100 includes a first structure 1100F and a second structure 1100S on the first structure 1100F.

The first structure 1100F is a peripheral circuit structure that includes a decoder circuit 1110, a page buffer 1120, and a logic circuit 1130. The second structure 1100S is a memory cell structure that includes the bit line BL, the common source line CSL, the plurality of word lines WL, first and second gate upper lines UL1 and UL2, first and second gate lower lines LL1 and LL2, and a plurality of memory cell strings CSTR between the bit line BL and the common source line CSL.

In the second structure 1100S, each of the plurality of memory cell strings CSTR includes lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously modified according to embodiments.

In some embodiments, the upper transistors UT1 and UT2 include a string selection transistor, and the lower transistors LT1 and LT2 include a ground selection transistor. The plurality of gate lower lines LL1 and LL2 are gate electrodes of the lower transistors LT1 and LT2, respectively. Each word line WL is a gate electrode of a respective memory cell transistor MCT, and the first and second gate upper lines UL1 and UL2 are gate electrodes of the upper transistors UT1 and UT2.

The common source line CSL, the plurality of gate lower lines LL1 and LL2, the plurality of word lines WL, and the plurality of gate upper lines UL1 and UL2 are electrically connected to the decoder circuit 1110 through a plurality of first connection wirings 1115 that extend from the second structure 1100S to the first structure 1100F. The plurality of bit lines BL are electrically connected to the page buffer 1120 through a plurality of second connection wirings 1125 that extend from the second structure 1100S to the first structure 1100F.

In the first structure 1100F, the decoder circuit 1110 and the page buffer 1120 perform a control operation on at least one of the plurality of memory cell transistors MCT. The decoder circuit 1110 and the page buffer 1120 are controlled by the logic circuit 1130.

The integrated circuit device 1100 communicates with the controller 1200 through an input/output pad 1101 electrically connected to the logic circuit 1130. The input/output pad 1101 is electrically connected to the logic circuit 1130 through an input/output connection line 1135 that extends from the second structure 1100S to the first structure 1100F.

The controller 1200 includes a processor 1210, a NAND controller 1220, and a host interface (I/F) 1230. In some embodiments, the electronic system 1000 includes a plurality of integrated circuit devices 1100, and in this case, the controller 1200 controls the plurality of integrated circuit devices 1100.

The processor 1210 controls the overall operation of the electronic system 1000 and the controller 1200. The processor 1210 operates according to firmware, and accesses the integrated circuit device 1100 by controlling the NAND controller 1220.

The NAND controller 1220 includes a NAND interface (NAND I/F) 1221 through which communication with the integrated circuit device 1100 is performed. Through the NAND interface 1221, a control command that controls the integrated circuit device 1100, data to be written to the plurality of memory cell transistors MCT of the integrated circuit device 1100, and data to be read from the plurality of memory cell transistors MCT of the integrated circuit device 1100, etc., is transmitted.

The host interface 1230 performs a communication between the electronic system 1000 and an external host. Upon receiving a control command from the external host through the host interface 1230, the processor 1210 controls the integrated circuit device 1100 in response to the control command.

Figure 11:
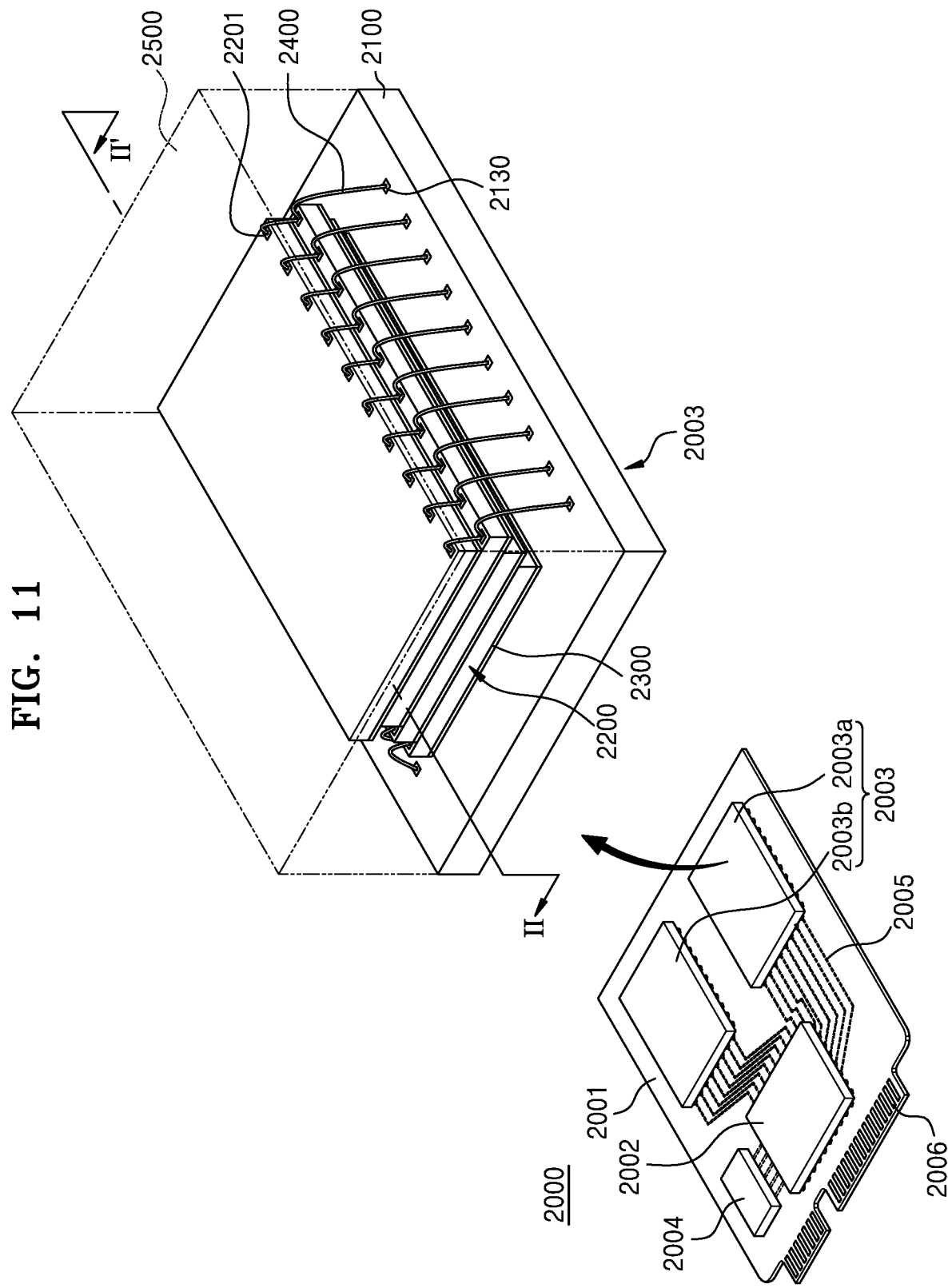
FIG. 11 is a perspective view of an electronic system that includes an integrated circuit device according to an embodiment.

FIG. 11 is a perspective view of an electronic system that includes an integrated circuit device according to an embodiment.

Referring to FIG. 11, an electronic system 2000 according to an embodiment includes a main substrate 2001, a controller 2002 mounted on the main substrate 2001, one or more semiconductor packages 2003, and DRAM 2004.

The main substrate 2001 includes a connector 2006 that includes a plurality of pins that connect with an external host. The number and arrangement of the plurality of pins in the connector 2006 may vary depending on a communication interface between the electronic system 2000 and the external host. In some embodiments, the electronic system 2000 communicates with the external host according to any of a plurality of interfaces, such as a USB, a Peripheral Component Interconnect Express (PCI-Express), a Serial Advanced Technology Attachment (SATA), an M-Phy for Universal Flash Storage (UFS), etc. In some embodiments, the electronic system 2000 operates by power received from the external host through the connector 2006. The electronic system 2000 may further include a power management integrated circuit (PMIC) that distributes the power to the controller 2002 and the semiconductor package 2003. The semiconductor package 2003 and the DRAM 2004 are connected to the controller 2002 by a plurality of wiring patterns 2005 formed on the main substrate 2001.

The controller 2002 writes data to or reads data from the semiconductor package 2003, and increases an operating speed of the electronic system 2000.

When the DRAM 2004 is a data storage space, the DRAM 2004 is a buffer memory that reduces a speed difference between the semiconductor package 2003 and the external host. The DRAM 2004 in the electronic system 2000 may operate as a cache memory, and provides a space for temporarily storing data in a control operation on the semiconductor package 2003. When the DRAM 2004 is included in the electronic system 2000, the controller 2002 further includes a DRAM controller that controls the DRAM 2004 in addition to the NAND controller that controls the semiconductor package 2003.

The semiconductor package 2003 includes first and second semiconductor packages 2003a and 2003b spaced apart from each other. Each of the first and second semiconductor packages 2003a and 2003b includes a plurality of semiconductor chips 2200. Each of the first and second semiconductor packages 2003a and 2003b includes a package substrate 2100, the plurality of semiconductor chips 2200 on the package substrate 2100, an adhesive layer 2300 disposed on a lower surface of each of the plurality of semiconductor chips 2200, a connection structure 2400 that electrically connects the plurality of semiconductor chips 2200 to the package substrate 2100, and a molding layer 2500 that covers the plurality of semiconductor chips 2200 and the connection structure 2400 on the package substrate 2100.

The package substrate 2100 may be a printed circuit board that includes a plurality of package upper pads 2130. Each of the plurality of semiconductor chips 2200 includes an input/output pad 2201. The input/output pad 2201 corresponds to the input/output pad 1101 of FIG. 10. The plurality of semiconductor chips 2200 include at least one of the integrated circuit devices 100, 200, and 300 described with reference to FIGS. 3 to 8.

In some embodiments, the connection structure 2400 is a bonding wire that electrically connects the input/output pad 2201 to the package upper pad 2130. Accordingly, in the first and second semiconductor packages 2003a and 2003b, the plurality of semiconductor chips 2200 are electrically connected to each other by a bonding wire method, and are electrically connected to the package upper pad 2130 of the package substrate 2100. In some embodiments, in the first and second semiconductor packages 2003a and 2003b, the plurality of semiconductor chips 2200 are electrically connected to each other by a connection structure that includes a through silicon via (TSV) instead of the connection structure 2400 of the bonding wire method.

In some embodiments, the controller 2002 and the plurality of semiconductor chips 2200 are included in one package. In some embodiments, the controller 2002 and the plurality of semiconductor chips 2200 are mounted on a separate interposer substrate that differs from the main substrate 2001, and the controller 2002 and the plurality of semiconductor chips 2200 are connected to each other by wiring formed on the interposer substrate.

Figure 12:
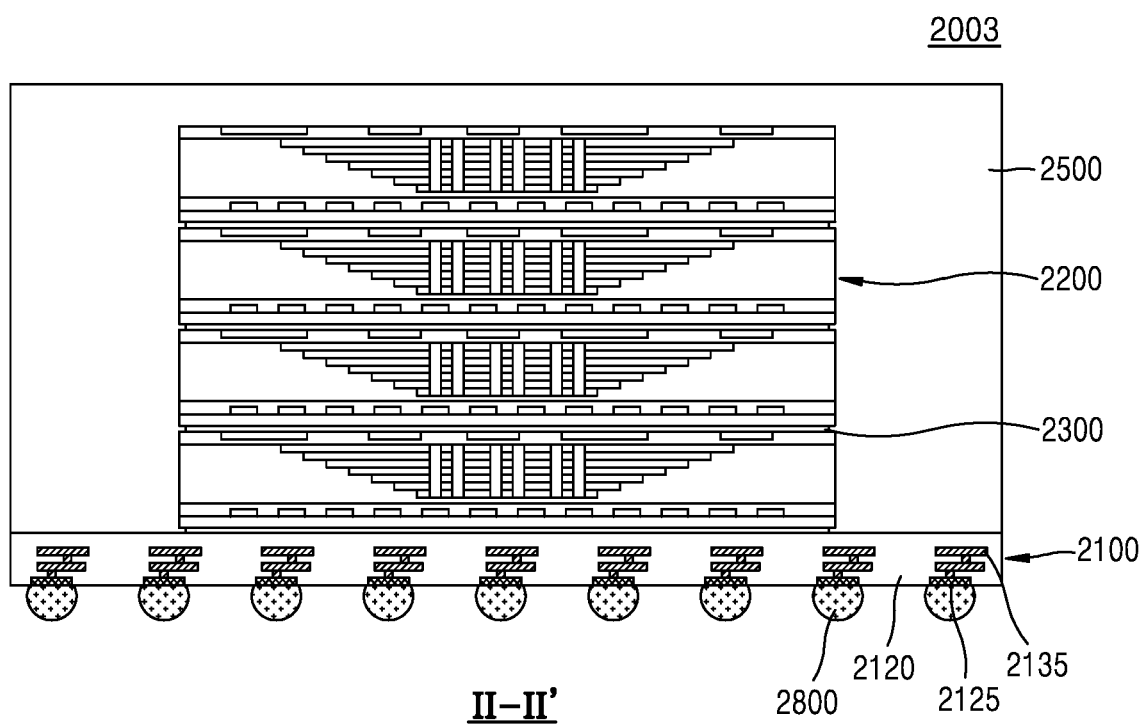
FIG. 12 is a cross-sectional view of a semiconductor package that includes an integrated circuit device according to an embodiment.

FIG. 12 is a cross-sectional view of a semiconductor package that includes an integrated circuit device according to an embodiment.

Referring to FIGS. 11 and 12 together, in a semiconductor package 2003 according to an embodiment, the package substrate 2100 is a printed circuit board.

The package substrate 2100 includes a package substrate body portion 2120, a plurality of package upper pads 2130 disposed on an upper surface of the package substrate body portion 2120, a plurality of lower pads 2125 disposed on a lower surface of the package substrate body portion 2120 or exposed through the lower surface, and a plurality of internal wirings 2135 that electrically connect the plurality of package upper pads 2130 to the plurality of lower pads 2125 in the package substrate body portion 2120.

The plurality of lower pads 2125 are respectively connected to the plurality of wiring patterns 2005 on the main substrate 2001 of the electronic system 2000 through a plurality of conductive bumps 2800. The plurality of semiconductor chips 2200 include at least one of the integrated circuit devices 100, 200, and 300 described with reference to FIGS. 3 to 8.

While embodiments of the inventive concept has been particularly shown and described with reference to the

What is claimed is:

1. An integrated circuit device, comprising:
a first structure and a second structure stacked on the first structure,
wherein the first structure comprises:
a first substrate;
a peripheral circuit disposed on the first substrate;
a first insulating layer that covers the first substrate and the peripheral circuit; and
a first bonding pad disposed in the first insulating layer and electrically connected to the peripheral circuit, and
wherein the second structure comprises:
a second substrate that includes a first side that faces the first substrate and a second side opposite to the first side;
a plurality of gate electrodes disposed on the first side of the second substrate, spaced apart from each other in a vertical direction, and stacked in a stair shape;
a first cell contact plug that penetrates a first conductive pad of a first gate electrode of the plurality of gate electrodes, is electrically connected to the first gate electrode, penetrates second gate electrodes of the plurality of gate electrodes that are disposed above the first gate electrode, and is electrically insulated from the second gate electrodes;
a first node separation structure that penetrates the second substrate and surrounds an upper part of the first cell contact plug positioned in the second substrate; and
a second bonding pad electrically connected to a lower part of the first cell contact plug and bonded to the first bonding pad.

2. The integrated circuit device of claim 1, wherein
the first cell contact plug has a horizontal width that increases with a decreasing distance in a vertical direction to the first substrate, and
the first node separation structure has a horizontal width that decreases with a decreasing distance in a vertical direction to the first substrate.

3. The integrated circuit device of claim 1, wherein
the first node separation structure includes an insulating material, and
a thickness of the first node separation structure is greater than a thickness of the second substrate.

4. The integrated circuit device of claim 3, wherein
a level of a lowermost surface of the first node separation structure is lower than a level of the first side of the second substrate, and
an uppermost surface of the first node separation structure is coplanar with the second side of the second substrate.

5. The integrated circuit device of claim 1, wherein
the first cell contact plug includes a vertical portion that extends in a vertical direction and a protruding portion that protrudes in a horizontal direction from the vertical portion, wherein the protruding portion contacts and is electrically connected to a sidewall of the first conductive pad.

6. The integrated circuit device of claim 5, wherein
the first conductive pad is formed on an edge part of the first gate electrode in the horizontal direction, and has a thickness in the vertical direction that is greater than a thickness of another part of the first gate electrode.

7. The integrated circuit device of claim 1, further comprising:
an insulating through support that penetrates the plurality of gate electrodes,
wherein
an uppermost surface of the insulating through support is coplanar with an uppermost surface of the first cell contact plug, and
a lowermost surface of the insulating through support is coplanar with a lowermost surface of the first cell contact plug.

8. The integrated circuit device of claim 7, wherein the second substrate surrounds an upper part of the insulating through support.

9. The integrated circuit device of claim 1, further comprising:
a common source line contact that penetrates the plurality of gate electrodes,
wherein
an uppermost surface of the common source line contact is coplanar with an uppermost surface of the first cell contact plug, and
a lowermost surface of the common source line contact is coplanar with a lowermost surface of the first cell contact plug.

10. The integrated circuit device of claim 9, further comprising:
a contact structure disposed on the second side of the second substrate,
wherein the contact structure includes
a first vertical contact that contacts an upper part of the common source line contact;
a second vertical contact that contacts the second side of the second substrate; and
a horizontal connection conductive layer that connects the first vertical contact to the second vertical contact in a horizontal direction.

11. An integrated circuit device, comprising:
a first structure that includes
a first substrate;
a peripheral circuit disposed on the first substrate;
a first insulating layer that covers the first substrate and the peripheral circuit; and
a plurality of first bonding pads disposed in the first insulating layer and electrically connected to the peripheral circuit, and
a second structure that includes
a second substrate that includes first and second sides opposite to each other, a cell region on the first side, and a connection region adjacent to the cell region;
a gate stack disposed on the first side of the second substrate, wherein the gate stack includes a plurality of gate electrodes and a plurality of insulating layers that extend in a horizontal direction and are alternately stacked in a vertical direction, and has a stair structure in the connection region;
a channel structure and a common source line contact disposed in the cell region and that extend through the gate stack in the vertical direction;
a plurality of cell contact plugs that are disposed in the connection region, contact and are electrically connected to a conductive pad of a corresponding gate electrode of the plurality of gate electrodes, and penetrate the connection region;
a plurality of node separation structures that surround upper parts of the plurality of cell contact plugs in the second substrate and insulate the plurality of cell contact plugs from the second substrate;

a contact structure disposed on the second side of the second substrate and that includes a first vertical contact that contacts an upper part of the common source line contact and a second vertical contact that contacts the second side of the second substrate; and a plurality of second bonding pads electrically connected to lower parts of the plurality of cell contact plugs and electrically connected to the plurality of first bonding pads, wherein the first structure and the second structure are bonded to each other.

12. The integrated circuit device of claim 11, wherein:
each of the plurality of cell contact plugs and the common source line contact has a horizontal width that increases with a decreasing distance in the vertical direction to the first substrate, and
each of the plurality of node separation structures, the first vertical contact, and the second vertical contact has a horizontal width that decreases with a decreasing distance in the vertical direction to the first substrate.

13. The integrated circuit device of claim 11, wherein an uppermost surface of each of the plurality of node separation structures is coplanar with the second side of the second substrate.

14. The integrated circuit device of claim 13, wherein at least a part of a lowermost surface of each of the plurality of node separation structures protrudes from the first side of the second substrate.

15. The integrated circuit device of claim 11, wherein:
the conductive pad is formed on an edge part of the gate electrode in the horizontal direction, and has a thickness in the vertical direction that is greater than a thickness of another part of the gate electrode.

16. The integrated circuit device of claim 15, wherein each of the plurality of cell contact plugs includes:
a vertical portion that extends in the vertical direction; and
a protruding portion that protrudes from the vertical portion in the horizontal direction, wherein
the protruding portion contacts a sidewall of the conductive pad of the gate electrode.

17. The integrated circuit device of claim 11, wherein the first vertical contact and the second vertical contact are electrically connected to each other by a horizontal connection conductive layer disposed in the horizontal direction.

18. The integrated circuit device of claim 11, wherein a level of a lowermost surface of the first vertical contact is closer to the first side of the second substrate than a level of a lowermost surface of the second vertical contact.

19. An electronic system, comprising:
a main substrate;
an integrated circuit device disposed on the main substrate; and
a controller disposed on the main substrate and that is electrically connected to the integrated circuit device;
wherein the integrated circuit device comprises a first structure and a second structure stacked on the first structure,
wherein the first structure comprises:
a first substrate;
a peripheral circuit disposed on the first substrate;
a first insulating layer that covers the first substrate and the peripheral circuit; and
a first bonding pad disposed in the first insulating layer and that is electrically connected to the peripheral circuit, and
wherein the second structure comprises:
a second substrate that includes a first side that faces the first substrate and a second side opposite to the first side;
a plurality of gate electrodes disposed on the first side of the second substrate and spaced apart from each other in a vertical direction and stacked in a stair shape;
a first cell contact plug that penetrates a first conductive pad of a first gate electrode of the plurality of gate electrodes, is electrically connected to the first gate electrode, penetrates second gate electrodes of the plurality of gate electrodes that are disposed above the first gate electrode, and is electrically insulated from the second gate electrodes;
a first node separation structure that penetrates the second substrate and surrounds an upper part of the first cell contact plug positioned in the second substrate; and
a second bonding pad electrically connected to a lower part of the first cell contact plug and bonded to the first bonding pad.

20. The electronic system of claim 19, wherein:
the main substrate further includes wiring patterns that electrically connect the integrated circuit device to the controller,
the first cell contact plug has a horizontal width that increases with decreasing distance in a vertical direction to the first substrate, and
the first node separation structure has a horizontal width that decreases with decreasing distance in a vertical direction to the first substrate.

* * * * *